US011948897B2

(12) United States Patent
Englekirk et al.

(10) Patent No.: US 11,948,897 B2
(45) Date of Patent: Apr. 2, 2024

(54) TRANSIENT STABILIZED SOI FETS

(71) Applicant: pSemi Corporation, San Diego, CA (US)

(72) Inventors: Robert Mark Englekirk, Littleton, CO (US); Keith Bargroff, San Diego, CA (US); Christopher C. Murphy, Lake Zurich, IL (US); Tero Tapio Ranta, San Diego, CA (US); Simon Edward Willard, Irvine, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 17/669,812

(22) Filed: Feb. 11, 2022

(65) Prior Publication Data

US 2022/0246550 A1 Aug. 4, 2022

Related U.S. Application Data

(60) Continuation of application No. 16/875,615, filed on May 15, 2020, now Pat. No. 11,251,140, which is a
(Continued)

(51) Int. Cl.
*H01L 23/60* (2006.01)
*H01L 21/762* (2006.01)
(Continued)

(52) U.S. Cl.
CPC ........ *H01L 23/60* (2013.01); *H01L 21/76264* (2013.01); *H01L 23/552* (2013.01);
(Continued)

(58) Field of Classification Search
CPC . H01L 23/60; H01L 21/76264; H01L 23/552; H01L 23/66; H01L 27/1203;
(Continued)

(56) References Cited

U.S. PATENT DOCUMENTS 5,416,043 A 5/1995 Burgener et al.
5,600,169 A 2/1997 Burgener et al.
(Continued)

FOREIGN PATENT DOCUMENTS

CN 101218683 7/2008
CN 104217938 12/2014
(Continued)

OTHER PUBLICATIONS

Retebo, Metasebia T., Office Action received from the USPTO dated Oct. 18, 2018 for U.S. Appl. No. 15/600,579, 6 pgs.
(Continued)

*Primary Examiner* — Metasebia T Retebo
(74) *Attorney, Agent, or Firm* — JAQUEZ LAND GREENHAUS & McFARLAND LLP; John Land, Esq.

(57) ABSTRACT

Integrated circuits (ICs) that avoid or mitigate creation of changes in accumulated charge in a silicon-on-insulator (SOI) substrate, particularly an SOI substrate having a trap rich layer. In one embodiment, a FET is configured such that, in a standby mode, the FET is turned OFF while maintaining essentially the same $V_{DS}$ as during an active mode. In another embodiment, a FET is configured such that, in a standby mode, current flow through the FET is interrupted while maintaining essentially the same $V_{GS}$ as during the active mode. In another embodiment, a FET is configured such that, in a standby mode, the FET is switched into a very low current state (a "trickle current" state) that keeps both $V_{GS}$ and $V_{DS}$ close to their respective active mode operational voltages. Optionally, S-contacts may be formed in an IC substrate to create protected areas that encompass FETs that are sensitive to accumulated charge effects.

9 Claims, 19 Drawing Sheets

Related U.S. Application Data division of application No. 15/600,579, filed on May 19, 2017, now Pat. No. 10,672,726.

(51) Int. Cl.

| | | |
|---|---|---|
| *H01L 23/552* | (2006.01) | |
| *H01L 23/66* | (2006.01) | |
| *H01L 27/12* | (2006.01) | |
| *H01L 29/10* | (2006.01) | |
| *H01L 29/786* | (2006.01) | |
| *H03K 17/0412* | (2006.01) | |
| *H03K 17/0416* | (2006.01) | |
| *H03K 17/042* | (2006.01) | |
| *H03K 17/14* | (2006.01) | |
| *H03K 17/687* | (2006.01) | |

(52) U.S. Cl.
CPC .......... *H01L 23/66* (2013.01); *H01L 27/1203* (2013.01); *H01L 27/1207* (2013.01); *H01L 27/1218* (2013.01); *H01L 29/1095* (2013.01); *H01L 29/78603* (2013.01); *H01L 29/78615* (2013.01); *H01L 29/78618* (2013.01); *H03K 17/04123* (2013.01); *H03K 17/04163* (2013.01); *H03K 17/04206* (2013.01); *H03K 17/145* (2013.01); *H03K 17/6872* (2013.01)

(58) Field of Classification Search
CPC ............. H01L 27/1207; H01L 27/1218; H01L 29/1095; H01L 29/78603; H01L 29/78615; H01L 29/78618; H03K 17/04123; H03K 17/04163; H03K 17/04206; H03K 17/145; H03K 17/6872
See application file for complete search history.

(56) References Cited

U.S. PATENT DOCUMENTS

| | | | |
|---|---|---|---|
| 6,400,207 B1 | 6/2002 | Ivanov et al. | |
| 6,593,799 B2 | 7/2003 | De | |
| 6,747,514 B1 | 6/2004 | Aude | |
| 7,414,289 B2 | 8/2008 | Wu et al. | |
| 7,910,993 B2 | 3/2011 | Brindle et al. | |
| 8,048,753 B2 | 11/2011 | Zhou et al. | |
| 8,169,108 B2 | 5/2012 | Dupuis et al. | |
| 8,593,128 B2 | 11/2013 | Burns et al. | |
| 9,197,194 B2 | 11/2015 | Reedy et al. | |
| 9,472,512 B1 | 10/2016 | Toh et al. | |
| 9,484,897 B2 | 11/2016 | Green et al. | |
| 9,837,412 B2 * | 12/2017 | Tasbas ............ | H01L 21/823475 |
| 9,837,965 B1 | 12/2017 | Wagh | |
| 9,847,348 B1 | 12/2017 | Abesingha et al. | |
| 10,276,371 B2 | 4/2019 | Englekirk | |
| 10,290,330 B1 | 5/2019 | Kamath | |
| 10,546,747 B2 | 1/2020 | Englekirk et al. | |
| 10,672,726 B2 | 6/2020 | Englekirk et al. | |
| 10,971,359 B2 | 4/2021 | Englekirk et al. | |
| 11,251,140 B2 | 2/2022 | Englekirk et al. | |
| 2002/0125921 A1 | 9/2002 | Van Wershoven | |
| 2003/0178654 A1 | 9/2003 | Thornton | |
| 2004/0077327 A1 | 4/2004 | Lim et al. | |
| 2004/0135639 A1 | 7/2004 | Maneatis | |
| 2006/0011807 A1 * | 1/2006 | Lee .................. | H04N 25/75 |
| | | | 348/E5.079 |
| 2006/0071304 A1 * | 4/2006 | Jagannathan ....... | H01L 29/1087 |
| | | | 257/659 |
| 2006/0087470 A1 | 4/2006 | Abdoulin | |
| 2007/0159150 A1 | 7/2007 | Hosokawa et al. | |
| 2008/0224755 A1 | 9/2008 | Jo | |
| 2009/0108258 A1 * | 4/2009 | An ..................... | H01L 23/3171 |
| | | | 257/E23.168 |
| 2009/0206817 A1 | 8/2009 | Ng et al. | |
| 2009/0283854 A1 | 11/2009 | Levy et al. | |
| 2010/0244934 A1 | 9/2010 | Botula et al. | |
| 2010/0244964 A1 | 9/2010 | Deguchi et al. | |
| 2010/0329013 A1 | 12/2010 | Shikata et al. | |
| 2011/0025422 A1 | 2/2011 | Marra et al. | |
| 2011/0278581 A1 | 11/2011 | Inoue et al. | |
| 2013/0187712 A1 | 7/2013 | Cabanilas et al. | |
| 2013/0310114 A1 | 11/2013 | Zohny et al. | |
| 2013/0314065 A1 | 11/2013 | Jian et al. | |
| 2014/0169038 A1 | 6/2014 | Kamath et al. | |
| 2014/0191322 A1 | 7/2014 | Botula et al. | |
| 2014/0266458 A1 | 9/2014 | Scott et al. | |
| 2014/0333365 A1 | 11/2014 | Takahashi | |
| 2015/0187753 A1 | 7/2015 | Campi, Jr. | |
| 2015/0206964 A1 | 7/2015 | Cheng et al. | |
| 2015/0236650 A1 | 8/2015 | Deo | |
| 2015/0270806 A1 | 9/2015 | Wagh et al. | |
| 2015/0280655 A1 | 10/2015 | Nobbe et al. | |
| 2016/0035899 A1 | 2/2016 | Stulemeijer et al. | |
| 2016/0141228 A1 | 5/2016 | Leobandung | |
| 2016/0164413 A1 | 6/2016 | Akiyama | |
| 2016/0277008 A1 | 9/2016 | Green et al. | |
| 2016/0277012 A1 | 9/2016 | Abesingha et al. | |
| 2017/0005111 A1 | 1/2017 | Verman et al. | |
| 2017/0149437 A1 | 5/2017 | Luo et al. | |
| 2017/0170177 A1 | 6/2017 | Tasbas et al. | |
| 2018/0053784 A1 * | 2/2018 | Cai .................. | H01L 21/84 |
| 2018/0083578 A1 | 3/2018 | Klaren et al. | |
| 2018/0337043 A1 | 11/2018 | Englekirk et al. | |
| 2018/0337146 A1 | 11/2018 | Englekirk et al. | |
| 2019/0057868 A1 | 2/2019 | Englekirk et al. | |
| 2020/0176252 A1 | 6/2020 | Englekirk et al. | |
| 2020/0350267 A1 | 11/2020 | Englekirk et al. | |
| 2023/0072964 A1 * | 3/2023 | Peidous ................. | H01L 21/84 |

FOREIGN PATENT DOCUMENTS

| | | |
|---|---|---|
| EP | 2731269 | 5/2014 |
| EP | 2787642 | 10/2014 |
| WO | 2009108391 | 9/2009 |
| WO | 2017099871 | 6/2017 |
| WO | 2018212975 | 11/2018 |
| WO | 2018212976 | 11/2018 |

OTHER PUBLICATIONS

Retebo, Metasebia T., Office Action received from the USPTO dated Mar. 7, 2019 for U.S. Appl. No. 15/600,579, 45 pgs.

Retebo, Metasebia T., Final Office Action received from the USPTO dated Jul. 26, 2019 for U.S. Appl. No. 15/600,579, 22 pgs.

Retebo, Metasebia T., Advisory Action received from the USPTO dated Nov. 5, 2019 for U.S. Appl. No. 15/600,579, 4 pgs.

Retebo, Metasebia T., Notice of Allowance received from the USPTO dated Jan. 27, 2020 for U.S. Appl. No. 15/600,579, 12 pgs.

PSemi Corporation, Response filed in the USPTO dated Oct. 31, 2018 for U.S. Appl. No. 15/600,579, 9 pgs.

PSemi Corporation, Response filed in the USPTO dated Apr. 9, 2019 for U.S. Appl. No. 15/600,579, 11 pgs.

PSemi Corporation, Response filed in the USPTO dated Oct. 23, 2019 for U.S. Appl. No. 15/600,579, 11 pgs.

Englekirk, et al., "Managed Substrate Effects for Stablized SOI FETs", patent application filed in the USPTO on May 19, 2017, U.S. Appl. No. 15/600,588, 62 pgs.

Inoussa, Mouloucoulay, Office Action received from the USPTO dated Sep. 22, 2016 for U.S. Appl. No. 14/964,412, 7 pgs.

Inoussa, Mouloucoulay, Office Action received from the USPTO dated Dec. 15, 2016 for U.S. Appl. No. 14/964,412, 12 pgs.

Tasbas, et al., Response filed in the USPTO dated Nov. 7, 2016 for U.S. Appl. No. 14/964,412, 5 pgs.

Tasbas, et al., Response filed in the USPTO dated Apr. 13, 2017 for U.S. Appl. No. 14/964,412, 10 pgs.

Tasbas, et al., Response filed in the USPTO dated Sep. 15, 2017 for U.S. Appl. No. 14/964,412, 12 pgs.

Emam, Mostafa, "RF SOI: from Material to ICs—an Innovative Characterization Approach", FD-SOI and RF-SOI Forum, Friday, Feb. 27, 2015, 35 pgs.

(56) References Cited

OTHER PUBLICATIONS

Roda, et al., "RF and Linear Performance of Commercial 200 mm Trap-Rich HR-SOI Wafers for SoC Applications", SiRF 2013, IEEE 2013, pp. 15-17.
Iperione, Analia, International Search Report and Written Opinion received from the EPO dated Dec. 14, 2016 for appln. No. PCT/US2016/054982, 16 pgs.
Botula, et al., "A Thin-film SOI 180nm CMOS RF Switch Technology", IBM Microelectronics, IEEE 2009, 9 pgs.
Sekar, et al., "Comparison of Substrate Effects in Sapphire, Trap-Rich and High Resistivity Silicon Substrates for RF-SOI Applications", IEEE 2015, pp. 37-39.
Neve, et al., "RF and Linear Performance of Commercial 200 mm trap-rich HR-SOI Wafters for SoC applications", IEEE 2013, pp. 15-17.
Kerr, et al., "Identification of RF Harmonic Distortion on Si Substrates and its Reduction using a Trap-Rich Layer", IEEE 2008, pp. 151-154.
Peregrine Semiconductor Corporation, Response and English translation filed in the TIPO dated Apr. 25, 2017 for appln. No. 105131544, 17 pgs.
Peregrine Semconductor Corporation, Request for Substantive Examination and Voluntary Amendment filed in the SIPO for appln. No. 201610885245.6, 7 pgs.
Peregrine Semiconductor Corporation, Demand and Amendment filed in the EPO dated Jun. 28, 2017 for appln. No. PCT/US2016/054982, 24 pgs.
Le, Dung Anh, Office Action received from the USPTO dated Jun. 30, 2017 for U.S. Appl. No. 15/385,618, 9 pgs.
Abesingha, et al., Response filed in the USPTO dated Jul. 31, 2017 for U.S. Appl. No. 15/385,618, 9 pgs.
Le, Dung Anh, Notice of Allowance received from the USPTO dated Sep. 5, 2017 for U.S. Appl. No. 15/385,618, 31 pgs.
Abesingha, et al., "Systems, Methods and Apparatus for Enabling High Voltage Circuts", patent application filed in the USPTO on Dec. 20, 2016, U.S. Appl. No. 15/385,618, 53 pgs.
Nguyen, Patricia T., Office Action received from the USPTO dated Mar. 9, 2017 for U.S. Appl. No. 15/268,297, 7 pgs.
Nguyen, Patricia T., Notice of Allowance received from the USPTO dated Jun. 26, 2017 for U.S. Appl. No. 15/268,297, 31 pgs.
Nguyen, Patricia T., Notice of Allowance received from the USPTO dated Sep. 22, 2017 for U.S. Appl. No. 15/268,297, 13 pgs.
Wagh, et al., Response filed in the USPTO dated Mar. 27, 2017 for U.S. Appl. No. 15/268,297, 8 pgs.
Inoussa, Mouloucoulay, Final Office Action received from the USPTO dated Jul. 18, 2017 for U.S. Appl. No. 14/964,412, 16 pgs.
Inoussa, Mouloucoulay, Notice of Allowance received from the USPTO dated Oct. 12, 2017 for U.S. Appl. No. 14/964,412, 12 pgs.
Ishigaki, Takashi, Doctorial Theses entitled "A Study on Silicon-on-Thin-Box (SOTB) CMOSFET for Low-Power LSIs", Sep. 2012, 129 pgs.
Luu, Chuong A., Office Action received from the USPTO dated Jan. 4, 2018 for U.S. Appl. No. 15/600,588, 7 pgs.
Luu, Chuong A., Office Action received from the USPTO dated Feb. 9, 2018 for U.S. Appl. No. 15/600,588, 15 pgs.
Englekirk, et al., Response filed in the USPTO dated Jan. 10, 2018 for U.S. Appl. No. 15/600,588, 8 pgs.
Englekirk, et al., Response filed in the USPTO dated Feb. 26, 2018 for U.S. Appl. No. 15/600,588, 8 pgs.
Simon, Volker, International Search Report and Written Opinion received from the USPTO dated Jul. 23, 2018 for appln. No. PCT/US2018/030179, 11 pgs.
Luu, Chuong A., Office Action received from the USPTO dated Nov. 8, 2018 for U.S. Appl. No. 15/600,588, 16 pgs.
Luu, Chuong A., Notice of Allowance received from the USPTO dated Feb. 21, 2019 for U.S. Appl. No. 15/600,588, 10 pgs.
Juhl, Andreas, Written Opinion of the International Preliminary Examining Authority received from the EPO dated Apr. 3, 2019 for appln. No. PCT/US2018/030191, 5 pgs.
Simon, Volker, Written Opinion of the International Preliminary Examining Authority received from the EPO dated Apr. 5, 2019 for appln. No. PCT/US2018/030179, 7 pgs.
Luu, Chuong A., Office Action received from the USPTO dated Jun. 13, 2019 for U.S. Appl. No. 16/167,424, 12 pgs.
Volker, Simon, International Preliminary Report on Patentability received from the EPO dated Aug. 12, 2019 for appln. No. PCT/US2018/030179, 19 pgs.
Juhl, Andreas, International Preliminary Report on Patentability received from the EPO dated Aug. 23, 2019 for appln. No. PCT/US2018/030191, 23 pgs.
Luu, Chuong A., Office Action received from the USPTO dated Jul. 10, 2020 for U.S. Appl. No. 16/689,836, 40 pgs.
Luu, Chuong A., Notice of Allowance received from the USPTO dated Oct. 9, 2019 for U.S. Appl. No. 16/167,424, 11 pgs.
Retebo, Metasebia T., Office Action received from the USPTO dated May 15, 2020 for U.S. Appl. No. 16/875,615, 31 pgs.
Retebo, Metasebia T., Notice of Allowance received from the USPTO dated Oct. 8, 2021 for U.S. Appl. No. 16/875,615, 7 pgs.
Fu, Wneying, English translation of Office Action received from the CNIPA dated Mar. 14, 2023 for appln. No. 201880032560.1, 6 pgs.

* cited by examiner

*2000*

```
For an integrated circuit susceptible to
accumulated charge and fabricated on a
silicon-on-insulator (SOI) substrate, providing at
least one FET having a drain, a source, a gate,
a $V_{DS}$ characteristic, a $V_{GS}$ characteristic, and a
signal path through the FET between the drain
and the source
```
— 2002

```
Configuring the at least one FET such that, in a
standby mode, the FET is switched into a very
low current state with respect to current flow
through the signal path that keeps both the $V_{GS}$
characteristic and the $V_{DS}$ characteristic of the
FET close to respective active mode
operational voltages for the $V_{GS}$ characteristic
and the $V_{DS}$ characteristic, thereby reducing
additional accumulated charge
```
— 2004

┌─────────────────────────────────────┐
│ For an integrated circuit susceptible to
│ accumulated charge and fabricated on a
│ silicon-on-insulator (SOI) substrate, providing at     ── 2402
│ least one field effect transistor (FET) having a
│ $V_{DS}$ characteristic and a $V_{GS}$ characteristic
└─────────────────────────────────────┘
                  ↓
┌─────────────────────────────────────┐
│ Configuring the at least one FET such that, in a
│ standby mode, no significant current flows
│ through the FET while maintaining essentially
│ the same $V_{DS}$ characteristic and $V_{GS}$          ── 2404
│ characteristic as during an active mode,
│ thereby eliminating or reducing changes in
│ accumulated charge
└─────────────────────────────────────┘

FIG. 24

TRANSIENT STABILIZED SOI FETS

CROSS-REFERENCE TO RELATED APPLICATIONS—CLAIM OF PRIORITY

This application is a continuation of commonly assigned U.S. application Ser. No. 16/875,615, filed on May 15, 2020 and "Transient Stabilized SOI FETs", to issue as U.S. Pat. No. 11,251,140 on Feb. 15, 2022, which is incorporated herein by reference in its entirety. Application No. 16,875,615 is a divisional of commonly assigned U.S. application Ser. No. 15/600,579, filed on May 19, 2017 and "Transient Stabilized SOI FETs", now U.S. Pat. No. 10,672,726 issued Jun. 2, 2020, which is incorporated herein by reference in its entirety.

This application may be related to U.S. patent application Ser. No. 15/600,588, filed May 19, 2017, entitled "Managed Substrate Effects For Stabilized SOI FETs", now U.S. Pat. No. 10,276,371, issued on Apr. 30, 2019, to U.S. patent application Ser. No. 14/964,412, filed Dec. 9, 2015, entitled "S-Contact for SOI", to U.S. patent application Ser. No. 15/385,618, filed Dec. 20, 2016, entitled "Systems, Methods and Apparatus for Enabling High Voltage Circuits", and to U.S. patent application Ser. No. 15/268,297, filed Sep. 16, 2016, entitled "Standby Voltage Condition for Fast RF Amplifier Bias Recovery", all assigned to the assignee of the present invention and hereby incorporated by reference.

BACKGROUND

(1) Technical Field

The invention relates to electronic circuits, and more particularly to radio frequency circuitry fabricated with silicon-on-insulator technology.

(2) Background

Modern radio frequency (RF) transceivers have become ubiquitous, with manifestations found in cellular telephones, wireless networks (e.g., WiFi, Bluetooth), laptop computers, tablets, computer peripheral devices (e.g., printers, keyboards, mice), etc. That ubiquity has increased demand for smaller and lower power RF transceiver circuit designs.

FIG. 1 is a block diagram of a typical prior art transceiver 100 such as the type that might be used in a cellular telephone. As illustrated, the transceiver 100 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes RF Front End, IF Block, Back-End, and Baseband sections (noting that in some implementations, the lines between sections may be blurred).

The receiver path Rx receives over-the-air RF signals through an antenna 102 and a switching unit 104, which may be implemented with active switching devices (e.g., field effect transistors or FETs), or with passive devices that implement frequency-domain multiplexing, such as a diplexer or duplexer. An RF filter 106 passes desired received RF signals to a low noise amplifier (LNA) 108, the output of which is combined in a mixer 110 with the output of a first local oscillator 112 to produce an intermediate frequency (IF) signal. The IF signal may be amplified by an IF amplifier 114 and subjected to an IF filter 116 before being applied to a demodulator 118, which may be coupled to a second local oscillator 120. The output of the demodulator 118 is transformed to a digital signal by an analog-to-digital converter 122 and provided to one or more system components 124 (e.g., a video graphics circuit, a sound circuit, memory devices, etc.). The converted digital signal may represent, for example, images (video or still), sounds, or symbols, such as text or other characters.

In the illustrated example, a transmitter path Tx includes Baseband, Back-End, IF Block, and RF Front End sections (again, in some implementations, the lines between sections may be blurred). Digital data from one or more system components 124 is transformed to an analog signal by a digital-to-analog converter 126, the output of which is applied to a modulator 128, which also may be coupled to the second local oscillator 120. The output of the modulator 128 may be subjected to an IF filter 130 before being amplified by an IF amplifier 132. The output of the IF amplifier 132 is then combined in a mixer 134 with the output of the first local oscillator 112 to produce an RF signal. The RF signal may be amplified by a driver 136, the output of which is applied to a power amplifier (PA) 138. The amplified RF signal may be coupled to an RF filter 140, the output of which is coupled to the antenna 102 through the switching unit 104.

The operation of the transceiver 100 is controlled by a microprocessor 142 in known fashion, which interacts with system control components (e.g., user interfaces, memory/storage devices, application programs, operating system software, power control, etc.). In addition, the transceiver 100 will generally include other circuitry, such as bias circuitry 146 (which may be distributed throughout the transceiver 100 in proximity to transistor devices), electrostatic discharge (ESD) protection circuits (not shown), testing circuits (not shown), factory programming interfaces (not shown), etc.

As should be apparent to one of ordinary skill in the art, some components of the transceiver 100 may be positioned in a different order (e.g., filters), and some of the components may be implemented as distinct integrated circuits (ICs). For example, the RF front end may be separately embodied from the rest of the circuitry (although there is a trend to try to integrate as much of the transceiver functionality as possible in a single IC). Other components can be (and usually are) added (e.g., additional filters, impedance matching networks, variable phase shifters/attenuators, power dividers, etc.). Importantly, in modern transceivers, there are often more than one receiver path Rx and transmitter path Tx—for example, to accommodate multiple frequencies and/or signaling modalities—so switching and control becomes more complex.

A challenge with electronic circuit design in general is that ideal components do not exist, particularly when dealing with RF signals. For example, the operational characteristics of many passive and active components in an RF signal path are frequency dependent. As another example, a significant problem with RF circuit design is eliminating or controlling unwanted cross-effects ("cross-talk") and self-effects, such as parasitic capacitances and inductances, undesired signal coupling, performance changes due to environment temperature changes as well as self-heating, and others. The problems of RF design become more acute when embodying RF circuits as ICs, where components materials, circuit juxtaposition, and power constraints add to the difficulties of optimizing operational parameters for all components. As one example, FETs are inherently designed to operate with fields, but fields do not have distinct edges and often cause cross-effects and self-effects. As another example, FETs have operating parameters that are subject to process, voltage, and temperature (PVT) variations. Accordingly, RF circuit designs embodied as ICs generally require optimizations of some circuit parameters at the expense of other parameters.

As an example of such trade-offs, as noted above, a transceiver 100 will generally include bias circuitry. FIG. 2 is a block diagram of a prior art bias voltage generation circuit 200. In this example, a stable reference voltage source 202 provides a reference voltage $V_{BG}$. The reference voltage source 202 may be, for example, a band-gap voltage reference, which is a temperature-independent voltage reference circuit widely used in ICs that produces an essentially constant voltage regardless of power supply variations, temperature changes, and load. The reference voltage $V_{BG}$ is applied to a voltage-to-current converter circuit 204, which essentially divides the reference voltage $V_{BG}$ by a resistance R to generate a reference current $I_{REF}$. The reference current $I_{REF}$ may be applied to a bias generator circuit 206 which generates a specific bias voltage $V_{BIAS}$ suitable for a particular amplifier 208. The bias generator circuit 206 may be simple or complex, depending on the needs of the overall circuit; examples of a variety of bias generator circuits are described in U.S. patent application Ser. No. 15/268,229, filed Sep. 16, 2016, entitled "Cascode Amplifier Bias Circuits", assigned to the assignee of the present invention and hereby incorporated by reference.

A notable characteristic of RF circuits in general is that different components may require different optimizations. For example, the amplifier 208 is in the RF signal path and is generally an analog circuit optimized for performance at RF frequencies. Conversely, while the components of the bias voltage generation circuit 200 are also generally analog circuitry, they generally do not operate at RF frequencies and they may need optimizations that differ from RF signal path components. A distinct challenge of RF circuit design is that optimization for some circuitry may adversely affect optimization of other circuitry.

In general, for most transceivers, the RF signal path components are the most important circuitry to optimize. It was recognized some time ago that semiconductor-on-insulator (SOI) IC technology is particularly useful for such optimization. An important aspect of SOI technology is that the semiconductor region in which circuitry is formed is isolated from the bulk substrate by an electrically insulating layer. An advantage of isolating circuitry from the bulk substrate is a dramatic decrease in cross-talk and parasitic capacitance, which significantly improves speed and power characteristics for RF components.

FIG. 3 is block diagram showing a typical prior art SOI IC structure 300 for a single FET. The SOI structure 300 includes a substrate 302, an insulator layer 304, and an active layer 306. The substrate 302 is typically a semiconductor material such as silicon. The insulator layer 304 is a dielectric which is often silicon dioxide formed through the oxidation of a silicon substrate 302; the insulator layer 304 is often referred to as a buried oxide (or "BOX") layer. The active layer 306 may include some combination of implants and/or layers that include dopants, dielectrics, polysilicon, metal wiring, passivation, and other materials to form active and/or passive electronic components and/or mechanical structures. For example, in the illustrated embodiment, a FET is shown comprising a source S, a drain D, and a gate G atop an insulating layer 308. Additional elements, not shown, may include contacts, conductive interconnections to other components and/or external connections, and protective coatings.

While the basic SOI IC structure 300 of FIG. 3 works reasonably well up to a point for RF circuitry such as transceiver components, as frequency increases and power specifications are reduced, cross-talk and parasitic elements again begin to affect such parameters as linearity and switching speed. Accordingly, other optimizations may be required. For example, FIG. 4 is block diagram showing an improved prior art SOI IC structure 400 for a single FET. The SOI structure 400 includes a high resistivity substrate 402, a trap rich layer 404, a BOX insulator layer 406, and an active layer 408 that includes a single example FET 410.

The high resistivity of the substrate 402 makes the impedance of the parasitic paths through the substrate 402 higher. Materials used for the high resistivity substrate 402 typically include very lightly doped silicon such that the high resistivity substrate 402 takes on some of the characteristics of an insulator. The use of high resistivity substrates alone has proven capable of extending the benefit of SOI structures for RF communication circuits by roughly two orders of frequency magnitude.

The trap rich layer 404 is a solution to another problem. Although high resistivity substrates alone are capable of reducing substrate loss when used in SOI IC structures, they are highly susceptible to another phenomenon called parasitic surface conduction. The problem of parasitic surface conduction occurs because the high resistivity substrate 402 is capable of terminating field lines, but a thin surface region of the high resistivity substrate 402 can be formed into an inversion or accumulation region as charge carriers are affected by changes in signal voltages in the active layer 408. The degree to which charge carriers in the thin surface region are displaced is directly altered by signals in the active layer 408. As a result, without the trap layer 404, the capacitance of the junction between the high resistivity substrate 402 and the active layer 408, as seen by the active layer 408, depends on the voltage applied, resulting in nonlinearity and a loss of signal purity. In addition, an applied voltage can invert this interface on the side of the high resistivity substrate 402 and create a channel-like layer within the thin surface region where charge can move very easily in a lateral direction despite the fact that the substrate layer 402 is highly resistive. Therefore, this effect can also lead to signal-degrading cross-talk in RF communication circuits.

Forming a trap rich layer 404 on top of the substrate layer 402 substantially mitigates parasitic surface conduction. The trap rich layer 404 is typically formed as a layer of amorphous or polycrystalline silicon on a top surface of the substrate 402, and significantly degrades the mobility of the charge carriers in the thin surface region of the substrate 402. Since the carriers cannot travel far, the effective resistance of the substrate 402 is preserved and the capacitance as seen by the active layer 408 is not as dependent upon the signals in the active layer 408. The improved RF performance of SOI IC substrates with a trap rich layer 404 is so marked that wafers having that configuration are commercially available.

Thus, SOI based IC technology improves RF performance, to a point; high resistivity SOI substrates further improve RF performance, to a point; and high resistivity SOI substrates with trap rich layers further still improves RF performance. However, the improved performance of SOI-based RF circuitry formed in the active layer 408 above the trap rich layer 404 can adversely affect desired operational characteristics of non-RF circuitry formed in the active layer 408 above the trap rich layer 404, such as switches and bias circuits.

For example, for some components (e.g., a power amplifier for use in a WiFi transceiver, such as one conforming to the IEEE 802.11ax or 802.11ac standards), the component is active for only short bursts of time (e.g., ~4 mS in a WiFi power amplifier) and in a low power mode (e.g., "sleep" or "standby" mode) for most of the time to save power. In the WiFi example, the standby power consumption for a power amplifier may be very low (e.g., <10 µA), but the amplifier may be required to have a very quick sleep-to-active transition time (e.g., <1 µS) and to achieve a very stable gain very soon (e.g., <30 µS) after becoming active. The low power standby mode may be achieved by essentially switching some of the active circuitry OFF. More generally, many radio-based systems, particularly battery-operated systems (e.g., cellular telephones and WiFi radios) make significant use of standby modes to conserve power usage and/or to preserve battery life. Transitioning from a standby mode to an active mode introduces transient effects, especially in bias circuits, which can take a long time to settle out. However, many RF and analog performance requirements typically do not allow a lot of recovery ("buffer") time. In general, such radio systems are designed to start transmitting a maximum amount of data as soon as possible. This requires that the radio system waken from standby mode back to active mode and be ready for full performance without significant transient effects.

Compounding the challenges of IC design is the fact that an SOI FET can develop an accumulated charge over time. For example, one type of accumulated charge depends upon the potentials at the source S, drain D, and gate G of the FET 410. More particularly, when used in certain SOI circuit implementations, conventional FETs may operate in an accumulated charge regime. This phenomenon is also referred to as a "floating body effect" or "kink effect", and more generally is the effect of dependence of the body potential of an SOI FET on the history of its biasing and carrier recombination processes. The body of the FET forms a capacitor with respect to the insulated substrate, and accordingly charge accumulates on this capacitor. The accumulated charge may cause adverse effects, such as opening of parasitic transistors in the structure and causing OFF-state leakages (resulting in higher current consumption), and also causes a history effect, which is the dependence of the threshold voltage $V_{TH}$ of a FET on the previous states of the FET.

Another aspect of accumulated charge is related to the OFF state of a FET and the resultant effect on device linearity, and is described in U.S. Pat. No. 7,910,993 B2, issued Mar. 22, 1011, entitled "Method and Apparatus for use in Improving Linearity of MOSFET'S using an Accumulated Charge Sink" and assigned to the assignee of the present invention.

A trap rich layer 404 on an SOI substrate 402 can be a separate source of accumulated charge. For example, when FETs in the active layer switch between ON and OFF states, the changing electrical fields accompanying such change in state can cause charge to accumulate between the trap rich layer 404 and the BOX insulator layer 406. The high impedance nature of the trap rich layer 404 hinders dissipation of that trapped accumulated charge.

Regardless of source, accumulated charge can take a long time to equilibrate (e.g., >4 mS), and can affect the intrinsic properties of a FET device (e.g., the threshold voltage of the device, $V_{TH}$). Thus, turning most or all switch FETs OFF to achieve a standby mode power level specification—as in the WiFi example above—results in accumulated charge in or near the trap rich layer 404 which takes time to dissipate when the FETs are turned back ON to the point of stable gain; that time may exceed a required sleep-to-active transition specification.

Anything that affects the operating point of a FET (e.g., $V_{TH}$, biasing, current $I_{DS}$, etc.) generally adversely impacts the performance of circuits based on such devices, such as the gain stability of an amplifier circuit. Because of the accumulated charge phenomenon, SOI FETs essentially have "memory": that is, changing the operating point of a FET involves also settling the body of the FET and the substrate to a new potential. Further, neighboring FETs and charged nodes can affect the intrinsic properties of a FET. Under such conditions, turning a FET completely OFF and then getting it to turn ON and be completely stable immediately is quite challenging.

Even providing substrate contacts (S-contacts) to mitigate accumulated charges of various types, as taught in U.S. patent application Ser. No. 14/964,412 referenced above, does not fully mitigate the problem during operation (even if the contacts are ohmic), due to the high resistivity of the substrate 402 restricting the flow of charge. Moreover, anything coupling to the substrate 402 may change its potential, thereby affecting nearby FET devices.

Prior attempts to mitigate the accumulated charge problem for FETs fabricated on SOI substrates having a trap rich layer include improving the effectiveness of body ties (such as by interspersing ties on the source side of a FET), using shorter width and/or longer length FETs to lessen accumulated charge (noting that longer length FETs generally do not work for power amplifiers), or adopting process techniques to reduce body-tie resistance. Attempts have also been made at the circuit level to compensate for the effects of the accumulated charge problem (rather than actually mitigate the problem), such as by creating replica circuits to try to track out gain variation due to accumulated charge. However, such circuit specific solutions are generally inadequate as a general solution.

Accordingly, there is a need for methods and circuits that eliminate or reduce the formation of accumulated charge in SOI substrates having a trap rich layer, or which mitigate the effects of accumulated charge on the performance of FETs fabricated on SOI substrates having a trap rich layer. The present invention addresses these and other needs.

SUMMARY OF THE INVENTION

The invention encompasses several types of radio frequency (RF) integrated circuits (ICs) that avoid or mitigate creation of accumulated charge in a silicon-on-insulator (SOI) substrate, particularly an SOI substrate having a trap rich layer, by avoiding a fully OFF state for at least some field effect transistors (FETs) within the circuit. By keeping the standby operating conditions of such critical FETs at the active state or as close to the active state as possible, accumulated charge is stabilized at a near-constant level. An important insight into the functioning of such FETs was the realization that the less that certain node voltages of FETs within an SOI IC change, the more stable the charge that may accumulate as a result of circuit activity in the active layer of an IC.

In a first general embodiment, a FET is configured such that, in a standby mode, the FET is turned OFF while maintaining essentially the same $V_{DS}$ as during an active mode, thereby eliminating or reducing changes in accumulated charge.

In a second general embodiment, a FET is configured such that, in a standby mode, current flow through the FET is interrupted while maintaining essentially the same $V_{GS}$ as during the active mode, thereby eliminating or reducing changes in accumulated charge.

In a third general embodiment, a FET is configured such that, in a standby mode, the FET is switched into a very low current state (a "trickle current" state) that keeps both $V_{GS}$ and $V_{DS}$ close to their respective active mode operational voltages, thereby reducing changes in accumulated charge.

In some embodiments, S-contacts are formed in an IC substrate to create protected areas that encompass FETs that are sensitive to accumulated charge effects. More specifically, S-contacts substantially surround each circuit to be protected, essentially creating corresponding "wells" surrounded at least in part by S-contact "rings". The rings of S-contacts reduce substrate impedance and thus settling time of the substrate voltage under the circuits, help in shielding the circuits from electrical interference, help in draining accumulated charge from certain layers of the IC, and help to improve impedance matching for the circuits within the wells by preventing uneven substrate potential between circuits.

Notably, embodiments of the invention, particularly the "trickle current" approach described below, help resolve a number of accumulated charge effects of SOI substrates (particularly SOI substrates having a trap rich layer), including floating body effects.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 20 is a process flow diagram showing a fifth method for eliminating or reducing changes in accumulated charge in an integrated circuit susceptible to accumulated charge and fabricated on an SOI substrate.

FIG. 24 is a process flow diagram 2400 showing a ninth method for eliminating or reducing changes in accumulated charge in an integrated circuit susceptible to accumulated charge and fabricated as part of an integrated circuit on a silicon-on-insulator (SOI) substrate.

Like reference numbers and designations in the various drawings indicate like elements.

DETAILED DESCRIPTION OF THE INVENTION

The invention encompasses several types of radio frequency (RF) integrated circuits (ICs) that avoid or mitigate creation of accumulated charge in a silicon-on-insulator (SOI) substrate, particularly an SOI substrate having a trap rich layer, by avoiding a fully OFF state for at least some field effect transistors (FETs) within the circuit. By keeping the standby operating conditions of such critical FETs at the active state or as close to the active state as possible, accumulated charge is stabilized at a near-constant level. An important insight into the functioning of such FETs was the realization that the less that certain node voltages of FETs within an SOI IC change, the more stable the charge that may accumulate as a result of circuit activity in the active layer of an IC.

In specific applications, use of one or more embodiments of the present invention lowers standby power consumption of FETs while enabling a very quick sleep-to-active transition time (e.g., <1 µS) and achieving a very stable gain very soon after becoming active (e.g., <0.05 dB gain stability in <30 µS).

Notably, embodiments of the invention, particularly the "trickle current" approach described below, help resolve a number of accumulated charge effects of SOI substrates (particularly SOI substrates having a trap rich layer), including floating body effects.

Fixed $V_{DS}$ Embodiment

Figure 5A:
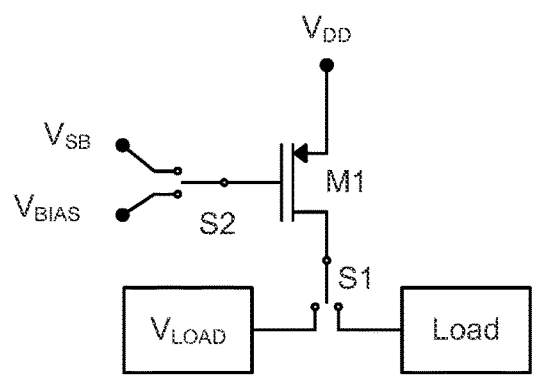
FIG. 5A is a schematic diagram of a first embodiment of the present invention that stabilizes $V_{DS}$ of a FET when in a standby mode.

FIG. 5A is a schematic diagram of a first embodiment of the present invention that stabilizes $V_{DS}$ of a FET when in a standby mode. Shown is a P-type FET M1 coupled between a supply voltage $V_{DD}$ and a controlled through-path switch S1. The gate of M1 is coupled to either a bias voltage $V_{BIAS}$ or to a standby voltage $V_{SB}$ (which may be $V_{DD}$) through a controlled gate switch S2. As an example, FET M1 may be a component of a power amplifier bias circuit.

Figure 5B:
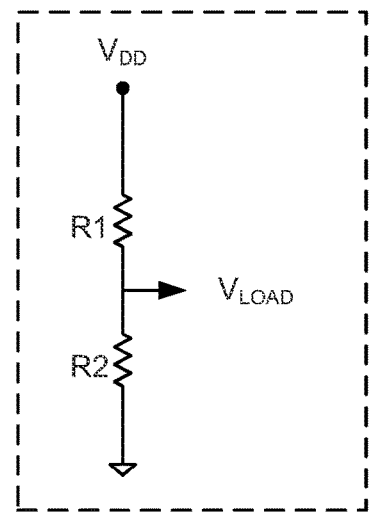
FIG. 5B is a schematic of one circuit for generating $V_{LOAD}$ for the circuit of FIG. 5A.

The through-path switch S1 may be switched to connect M1 to either a Load or a "pseudo" load $V_{LOAD}$. $V_{LOAD}$ may be provided by a voltage supply that is approximately equal to the voltage present on the drain of M1 during active mode operation. FIG. 5B is a schematic of one circuit for generating $V_{LOAD}$ for the circuit of FIG. 5A. In this example, $V_{LOAD}$ is generated by a simple resistive divider circuit comprising resistances R1 and R2 series coupled between $V_{DD}$ and circuit ground. The voltage for $V_{LOAD}$ depends on $V_{DD}$ and the ratio of R1 to R2. Other circuitry may be coupled between M1 and $V_{DD}$ and/or between M1 and the Load. An NFET version of the circuit of FIG. 5A would look similar, but "upside down": S1, Load, and $V_{LOAD}$ would be connected between $V_{DD}$ and M1, with the source of the NFET version of M1 coupled to circuit ground; the gate of M1 would be switched between $V_{BIAS}$ and circuit ground, and the drain of M1 would be switched between Load and $V_{LOAD}$ by S1.

As should be apparent to one of ordinary skill in the art, S1 and S2 may each be implemented as FETs coupled in conventional fashion to function as a single-pole, double throw (SPDT) switch. The difference between M1 and S1/S2 is that M1 is generally modulated by an applied input signal (not shown) and essentially behaves as a variable resistor, while S1 and S2 have two binary states, connecting a common terminal to either a first or a second node (in FIG. 5A, S1 and S2 are drawn as being in a neutral position but both are generally binary).

Figure 5C:
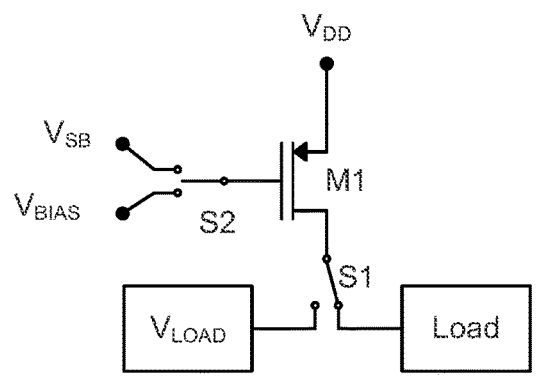
FIG. 5C is a schematic diagram of the circuit of FIG. 5A configured in an active (non-standby) mode.

FIG. 5C is a schematic diagram of the circuit of FIG. 5A configured in an active (non-standby) mode. In this configuration, the state of S1 is set to couple M1 to the Load and the state of S2 is set to couple the gate of M1 to $V_{BIAS}$. Accordingly, all currents to the gate of M1 and through M1 (i.e., source-drain current $I_{DS}$) flow normally, and M1 is in an active ON mode.

Figure 5D:
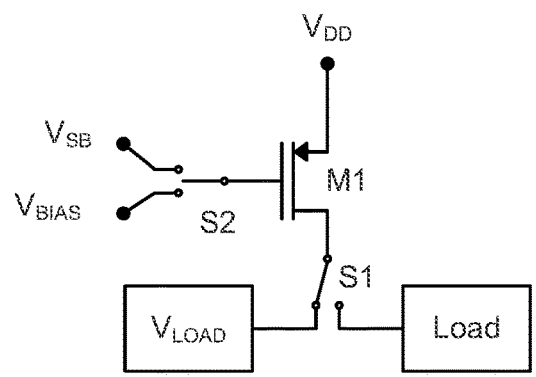
FIG. 5D is a schematic diagram of the circuit of FIG. 5A configured in a standby mode.

FIG. 5D is a schematic diagram of the circuit of FIG. 5A configured in a standby mode. In this configuration, the state of S1 is set to couple M1 to $V_{LOAD}$ and the state of S2 is set to couple the gate of M1 to $V_{SB}$, where $V_{SB}$ is set at a value that will turn all currents OFF. For example, by applying $V_{SB}=V_{DD}$ to the gate of M1, the gate-to-source voltage $V_{GS}$ of M1 becomes 0 V, turning M1 OFF. Since $V_{LOAD}$ is approximately equal to the voltage present on the drain of M1 during active mode operation, then $V_{DS}$ across M1 is essentially the same as during the active (non-standby) mode, thus reducing operating point changes to $V_{DS}$. Since $V_{DS}$ of M1 remains essentially unchanged when shifting from the active mode to the standby mode, little or no additional charge can accumulate that would adversely affect the switching characteristics of M1. The result is that M1 can be rapidly returned to the active mode by toggling S1 and S2 back to the configuration shown in FIG. 5C.

Control signals (not shown) for switches S1 and S2 may be provided, for example, from a microprocessor 142, or from dedicated power control circuitry or external circuitry (for example, if M1 is part of a power amplifier IC that does not include all of the circuitry for a complete transceiver).

While FIGS. 5A, 5C, and 5D depict a P-type FET, the same principle applies to an N-type FET: in a standby mode, turn the FET OFF while maintaining essentially the same $V_{DS}$ as during the active mode, thereby eliminating or reducing changes in accumulated charge.

In summary, this aspect of the invention encompasses an integrated circuit susceptible to accumulated charge and fabricated on an SOI substrate (particularly an SOI substrate having a trap rich layer), including at least one FET having a $V_{DS}$ characteristic and configured such that, in a standby mode, the FET is turned OFF while maintaining essentially the same $V_{DS}$ characteristic as during an active mode, thereby eliminating or reducing changes in accumulated charge in or near the SOI substrate and/or any trap rich layer and/or elsewhere in the FET (e.g., at the gate, drain, or source of the FET).

This aspect of the invention further encompasses a circuit fabricated on an SOI substrate (particularly an SOI substrate having a trap rich layer) as part of an integrated circuit susceptible to accumulated charge, the circuit including: at least one FET having a drain, a source, a gate, a $V_{DS}$ characteristic, and a signal path through the FET between the drain and the source; a first switch coupled to the gate of the FET, configured to switchably couple the gate to one of a bias voltage or a standby voltage source; and a second switch coupled to the signal path of the FET, configured to switchably couple the signal path to one of a load or a pseudo-load voltage source; wherein, in an active mode, the first switch couples the gate of the FET to the bias voltage and the second switch couples the signal path of the FET to the load; and wherein, in a standby mode, the first switch couples the gate of the FET to the standby voltage source and the second switch couples the signal path of the FET to the pseudo-load voltage source, thereby maintaining essentially the same $V_{DS}$ characteristic as during the active mode, and thereby eliminating or reducing changes in accumulated charge in or near the SOI substrate and/or any trap rich layer and/or elsewhere in the FET (e.g., at the gate, drain, or source of the FET).

Fixed $V_{GS}$ Embodiment

Figure 6A:
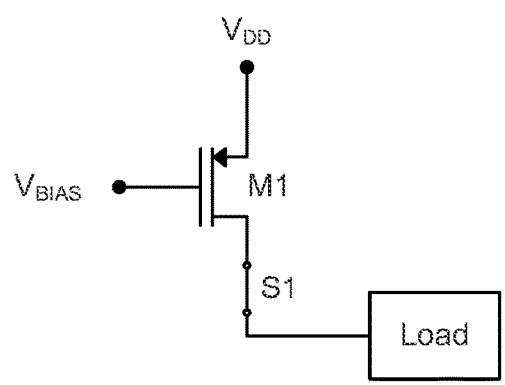
FIG. 6A is a schematic diagram of a second embodiment of the present invention that stabilizes $V_{GS}$ of a FET when in a standby mode.
Figure 6B:
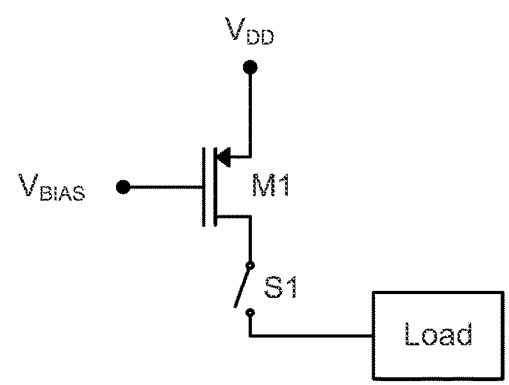
FIG. 6B is a schematic diagram of the circuit of FIG. 6A, but configured in a standby mode.

FIG. 6A is a schematic diagram of a second embodiment of the present invention that stabilizes $V_{GS}$ of a FET when in a standby mode. Shown is a P-type FET M1 coupled between a supply voltage $V_{DD}$ and a controlled through-path switch S1, which in turn is coupled to a Load. The gate of M1 is coupled to a bias voltage $V_{BIAS}$. S1 may be implemented as a FET coupled in conventional fashion to function as a single-pole, single throw (SPST) switch. Accordingly, S1 has two binary states, a CLOSED state (as shown in FIG. 6A) and an OPEN state (as shown in FIG. 6B). As an example, FET M1 may be a component of a bias circuit for a power amplifier. Further, other circuitry may be coupled between M1 and $V_{DD}$ and/or between M1 and the Load. An NFET version of the circuit of FIG. 6A would look similar, but "upside down": S1 and Load would be between $V_{DD}$ and the drain of M1, with the source of the NFET version of M1 coupled to circuit ground, the gate of M1 connected to $V_{BIAS}$, and the drain of M1 coupled through S1 to Load.

In FIG. 6A, M1 is configured in an active (non-standby) mode. In this configuration, the state of S1 is set to CLOSED, thus coupling M1 to the Load. Accordingly, all currents to the gate of M1 and through M1 (i.e., source-drain current $I_{DS}$) flow normally, and M1 is in an active ON mode.

FIG. 6B is a schematic diagram of the circuit of FIG. 6A, but configured in a standby mode. In this configuration, the state of S1 is set to OPEN and hence current cannot flow through M1 to the Load. More particularly, $V_{DS}$ of M1 is 0 V, and $V_{GS}$ of M1 does not change, thus reducing operating point changes to $V_{GS}$. Since $V_{GS}$ of M1 remains essentially unchanged when shifting from the active mode to the standby mode, little or no additional charge can accumulate that would adversely affect the switching characteristics of M1. The result is that M1 can be rapidly returned to the active mode by toggling S1 back to the configuration shown in FIG. 6A.

Again, control signals (not shown) for switch S1 may be provided, for example, from a microprocessor 142, or from dedicated power control circuitry or external circuitry. While FIGS. 6A and 6B depict a P-type FET, the same principle applies to an N-type FET: in a standby mode, interrupt current flow ($I_{DS}$) through the FET while maintaining essentially the same $V_{GS}$ as during the active mode, thereby eliminating or reducing changes in accumulated charge.

In summary, this aspect of the invention encompasses an integrated circuit susceptible to accumulated charge and fabricated on an SOI substrate (particularly an SOI substrate having a trap rich layer), including at least one FET having a $V_{GS}$ characteristic and configured such that, in a standby mode, current flow through the FET is interrupted while maintaining essentially the same $V_{GS}$ characteristic as during the active mode, thereby eliminating or reducing changes in accumulated charge in or near the SOI substrate and/or any trap rich layer and/or elsewhere in the FET (e.g., at the gate, drain, or source of the FET).

This aspect of the invention further encompasses a circuit fabricated on an SOI substrate (particularly an SOI substrate having a trap rich layer) as part of an integrated circuit susceptible to accumulated charge, the circuit including: at least one FET having a drain, a source, a gate, a $V_{GS}$ characteristic, and a signal path through the FET between the drain and the source; and a switch coupled to the signal path of the FET, configured to switchably couple the signal path to a load or interrupt current flow through the signal path of the FET; wherein, in an active mode, the switch couples the signal path of the FET to the load; and wherein, in a standby mode, the switch interrupts current flow through the signal path of the FET, thereby maintaining essentially the same $V_{GS}$ characteristic as during the active mode, and thereby eliminating or reducing changes in accumulated charge in or near the SOI substrate and/or any trap rich layer and/or elsewhere in the FET (e.g., at the gate, drain, or source of the FET).

Trickle Current Embodiment

In the first and second embodiments described above, either $V_{GS}$ or $V_{DS}$ was set to essentially 0 V to turn current flow through a FET OFF or interrupt such current flow. However, to meet a particular power consumption specification, a FET does not necessarily have to be shut completely OFF or have all current flow interrupted; instead, the FET can be switched into a very low current state (a "trickle current" state) that keeps both $V_{GS}$ and $V_{DS}$ close to their respective active mode operational voltages. Essentially, trickle current embodiments of the invention allow enough current to pass through a FET to maintain an active conduction channel in the FET. In contrast, if a FET is shut OFF completely, the conduction channel is no longer formed and needs to be re-formed when bring the FET out of a standby mode. Effectively, a trickle current mode FET circuit passes just barely enough current to keep the conduction channel active and the FET ready to turn ON when transitioning from the standby mode to the active mode. For example, a trickle current in standby mode of less than 1/1,000 of the active mode current will suffice for many applications, while in other applications, a trickle current in standby mode of less than 1/10,000 or even 1/100,000 of the active mode current may be more useful. As another example, in one power amplifier bias circuit, the active mode current consumption was about 10 mA, while the standby mode current consumption was in the range of about 0.1-1 µA.

Figure 7A:
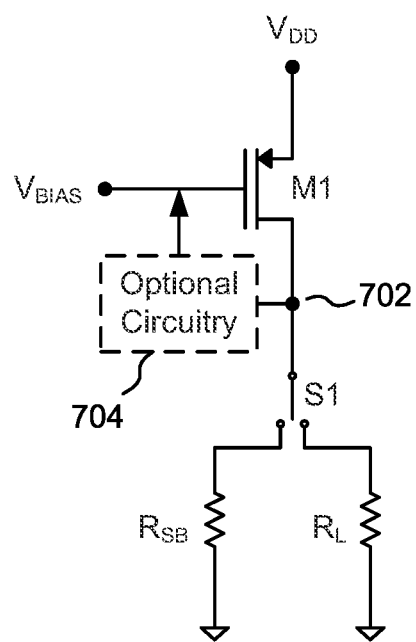
FIG. 7A is a schematic diagram of a third embodiment of the present invention that provides a trickle current state for a PFET when in a standby mode.
Figure 8:
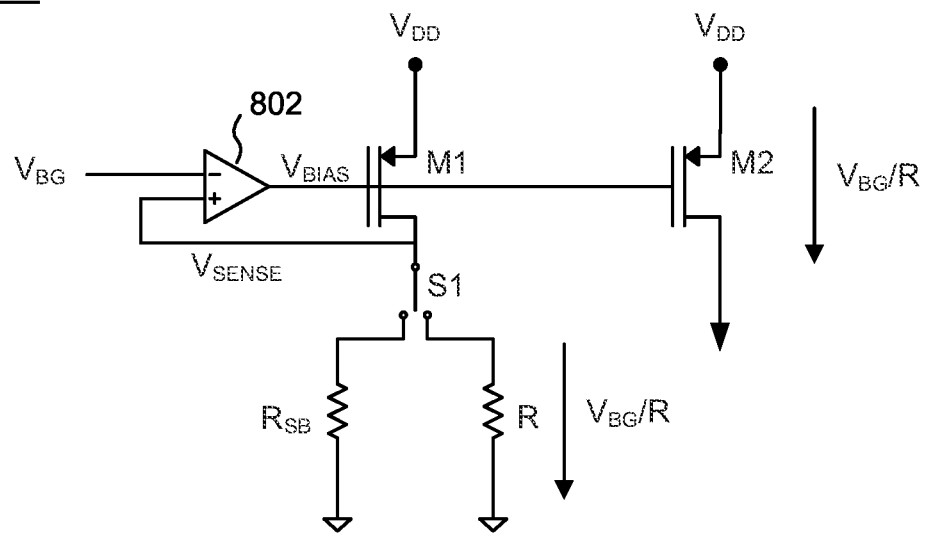
FIG. 8 is a schematic diagram of a current mirror circuit for providing a reference current $V_{BG}/R$, such as to the bias generator circuit of FIG. 2.

FIG. 7A is a schematic diagram of a third embodiment of the present invention that provides a trickle current state for a PFET when in a standby mode. Shown is a P-type FET M1 coupled between a supply voltage $V_{DD}$ and a controlled through-path switch S1. The gate of M1 is coupled to a bias voltage $V_{BIAS}$. Also coupled to the gate of the M1 PFET is a feedback voltage 702 from the drain of M1 that provides control over the $V_{GS}$ of M1; the feedback voltage 702 may be controlled or modified in some applications by optional circuitry 704 (an example of one such control circuit is shown in FIG. 8). Note that the feedback voltage 702 may be $V_{BIAS}$; that is, no external bias voltage is applied to the gate of M1, just the feedback voltage 702. As in the above examples, FET M1 may be a component of a power amplifier bias circuit.

The through-path switch S1 may be switched to connect M1 to either an active mode resistance $R_L$ (which may be provided by a Load) or a standby mode resistance $R_{SB}$. As in the embodiments described above, S1 may be implemented as FETs coupled in conventional fashion to function as a single-pole, double throw (SPDT) switch such that S1 has two binary states, connecting a common terminal to either a first or a second node (S1 is drawn as being in a neutral position but is generally binary). Other circuitry may be coupled between M1 and $V_{DD}$ and/or between M1 and $R_L$.

When the circuit of FIG. 7A is configured in an active (non-standby) mode, the state of S1 is set to couple M1 to $R_L$. Accordingly, current through M1 flows normally, and M1 is in an active ON mode. When the circuit of FIG. 7A is configured in a standby mode, the state of S1 is set to couple M1 to $R_{SB}$. Current through M1 is primarily controlled by the gate of M1. When $R_L$ is changed to $R_{SB}$, $I_{DS}$ must necessarily change, which happens automatically by the concurrent change to the $V_{GS}$ of M1 by means of the feedback voltage 702 (if $V_{BIAS}$ was a fixed value and $R_L$ was switched to $R_{SB}$, $V_{DS}$ would be near 0 V because the normal mode $I_{DS} \times R_{SB}$ is much greater than $V_{DD}$).

The resistance of $R_{SB}$ should be substantially greater than the resistance of $R_L$ so as to impede the flow of current through M1 down to a trickle. In general, $R_{SB}$ should have some repeatedly achievable resistance value (taking into account PVT affects) such that the trickle current is above the leakage current of M1. For example, in some embodiments, the ratio of resistances of $R_{SB}$ to $R_L$ ranges from approximately 100:1 to approximately 1000:1. Accordingly, because a small amount of trickle current continues to flow through M1 when $R_{SB}$ is switched into circuit, M1 is still active but at much diminished power and speed levels.

Figure 7B:
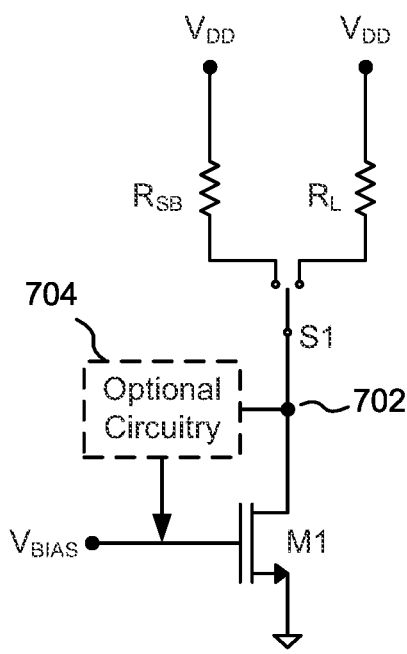
FIG. 7B is a schematic diagram of a fourth embodiment of the present invention that provides a trickle current state for an NFET when in a standby mode.

FIG. 7B is a schematic diagram of a fourth embodiment of the present invention that provides a trickle current state for an NFET when in a standby mode. Shown is an N-type FET M1 coupled between circuit ground and a controlled through-path switch S1 (S1 is drawn as being in a neutral position but is generally binary). The gate of M1 is coupled to a bias voltage $V_{BIAS}$. Also coupled to the gate of the M1 NFET is a feedback voltage 702 from the drain of M1 that provides control over the $V_{GS}$ of M1; the feedback voltage 702 may be controlled or modified in some applications by optional circuitry 704. Again note that $V_{BIAS}$ may be entirely provided by the feedback voltage 702.

The through-path switch S1 may be switched to connect M1 to $V_{DD}$ through either an active resistance $R_L$ (which may be provided by a Load) or a standby mode resistance $R_{SB}$. When the circuit of FIG. 7B is configured in an active (non-standby) mode, the state of S1 is set to couple M1 to $R_L$. Accordingly, current through M1 flows normally, and M1 is in an active ON mode. When the circuit of FIG. 7B is configured in a standby mode, the state of S1 is set to couple M1 to $V_{DD}$ through $R_{SB}$, and the $V_{GS}$ of M1 is changed as a function of the feedback voltage 702, thereby reducing $I_DS$. Again, the resistance of $R_{SB}$ should be substantially greater than the resistance of $R_L$ so as to impede the flow of current through M1 down to a trickle. Accordingly, because a small amount of current continues to flow through M1 when $R_{SB}$ is switched into circuit, M1 is still active but at much diminished power and speed levels.

Figure 7C:
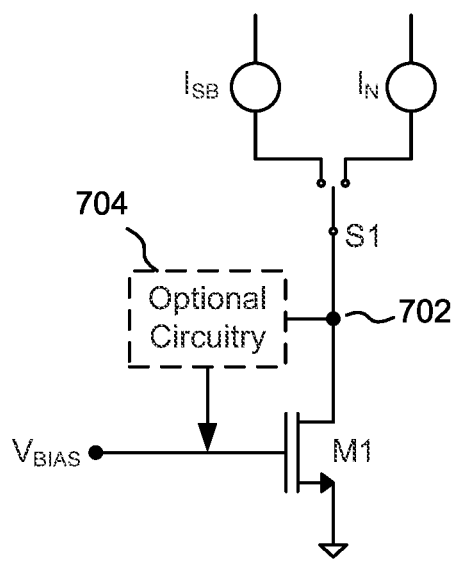
FIG. 7C is a schematic diagram of a fifth embodiment of the present invention that provides a trickle current state for an NFET when in a standby mode, utilizing fixed current sources.

FIG. 7C is a schematic diagram of a fifth embodiment of the present invention that provides a trickle current state for an NFET when in a standby mode, utilizing fixed current sources. Shown is an N-type FET M1 coupled between circuit ground and a controlled through-path switch S1 (S1 is drawn as being in a neutral position but is generally binary). The gate of M1 is coupled to a bias voltage $V_{BIAS}$. Also coupled to the gate of the M1 NFET is a feedback voltage 702 from the drain of M1 that provides control over the $V_{GS}$ of M1; again, the feedback voltage 702 may be controlled or modified in some applications by optional circuitry 704, and $V_{BIAS}$ may be entirely provided by the feedback voltage 702.

The through-path switch S1 may be switched to connect M1 either to an active mode current source $I_N$ or to a lower power standby mode current source $I_{SB}$. When the circuit of FIG. 7C is configured in an active (non-standby) mode, the state of S1 is set to couple M1 to $I_N$. Accordingly, current through M1 flows normally, and M1 is in an active ON mode. When the circuit of FIG. 7C is configured in a standby mode, the state of S1 is set to couple M1 to $I_{SB}$, and the $V_{GS}$ of M1 is changed as a function of the feedback voltage 702, thereby reducing $I_DS$. The current provided by $I_{SB}$ should be regulated to allow only a trickle of current to flow through M1. Thus, because a small amount of current continues to flow through M1 when $I_{SB}$ is switched into circuit, M1 is still active but at much diminished power and speed levels.

Figure 7D:
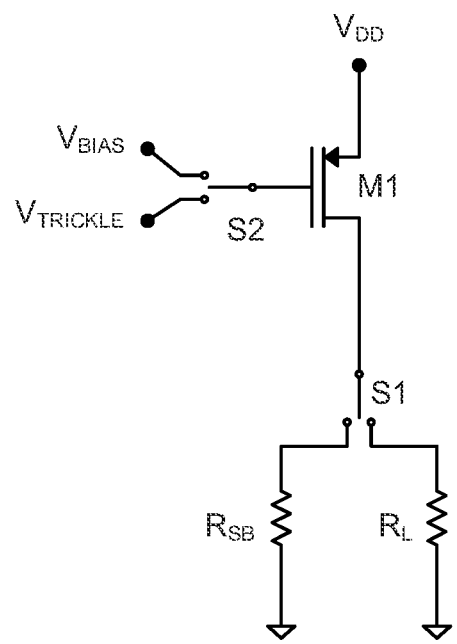
FIG. 7D is a schematic diagram of a fourth embodiment of the present invention that provides a trickle current state for a PFET when in a standby mode.

FIG. 7D is a schematic diagram of a fourth embodiment of the present invention that provides a trickle current state for a PFET when in a standby mode. Shown is a P-type FET M1 coupled between a supply voltage $V_{DD}$ and a controlled through-path switch S1. The gate of M1 is selectively coupled by switch S2 to a bias voltage $V_{BIAS}$ or to a trickle voltage $V_{TRICKLE}$. As in the above examples, FET M1 may be a component of a power amplifier bias circuit. The embodiments shown in FIGS. 7B and 7C can be similarly configured with a switch S2 to select a bias voltage $V_{BIAS}$ or a trickle voltage $V_{TRICKLE}$ rather than use a feedback voltage 702.

The through-path switch S1 may be switched to connect M1 to either an active mode resistance $R_L$ (which may be provided by a Load) or a standby mode resistance $R_{SB}$. Switch S2 would be controlled to concurrently select between $V_{BIAS}$ (for active mode) or $V_{TRICKLE}$ (for standby mode). As in the embodiments described above, S1 and S2 may each be implemented as FETs coupled in conventional fashion to function as a single-pole, double throw (SPDT) switch such that they have two binary states, connecting a common terminal to either a first or a second node (both S1 and S2 are drawn as being in a neutral position but are generally binary). Other circuitry may be coupled between M1 and $V_{DD}$ and/or between M1 and $R_L$.

When the circuit of FIG. 7D is configured in an active (non-standby) mode, the state of S1 is set to couple M1 to $R_L$ and the state of S2 is set to couple $V_{BIAS}$ to the gate of M1. Accordingly, current through M1 flows normally, and M1 is in an active ON mode. When the circuit of FIG. 7D is configured in a standby mode, the state of S1 is set to couple M1 to $R_{SB}$ and the state of S2 is set to couple $V_{TRICKLE}$ to the gate of M1, thereby reducing $I_{DS}$.

A common feature of the embodiments of FIGS. 7A-7D is that the switch S1 selectively couples the source-drain signal path to one of an active mode normal current flow path, or to a standby mode trickle current path in which current is either impeded (e.g., by $R_{SB}$) or regulated (e.g., by $I_{SB}$).

In all of the trickle current embodiments described above, since $V_{DS}$ and $V_{GS}$ of M1 change very little when shifting from the active mode to the standby mode, little additional charge can accumulate in or near the SOI substrate and/or any trap rich layer and/or elsewhere in the FET (e.g., at the gate, drain, or source of the FET). The result is that M1 can be rapidly returned to the active mode by toggling S1 back to the active mode configuration. In all cases, control signals (not shown) for switch S1 may be provided, for example, from a microprocessor 142, or from dedicated power control circuitry or external circuitry.

Regardless of specific implementation, the same principle applies to all trickle current embodiments: in a standby mode, substantially restrict current flow ($I_{DS}$) through a FET while keeping both $V_{GS}$ and $V_{DS}$ close to their respective active mode operational voltages, thereby reducing changes in accumulated charge.

In summary, this aspect of the invention encompasses an integrated circuit susceptible to accumulated charge and fabricated on an SOI substrate (particularly an SOI substrate having a trap rich layer), including at least one FET having a drain, a source, a gate, a $V_{DS}$ characteristic, a $V_{GS}$ characteristic, and a signal path through the FET between the drain and the source, and configured such that, in a standby mode, the FET is switched into a very low current state with respect to current flow through the signal path that keeps both the $V_{GS}$ characteristic and the $V_{DS}$ characteristic of the FET close to respective active mode operational voltages for the $V_{GS}$ characteristic and the $V_{DS}$ characteristic, thereby reducing changes in accumulated charge in or near SOI substrate and/or any the trap rich layer and/or elsewhere in the FET (e.g., at the gate, drain, or source of the FET).

This aspect of the invention further encompasses a circuit fabricated on an SOI substrate (particularly an SOI substrate having a trap rich layer) as part of an integrated circuit susceptible to accumulated charge, the circuit including: at least one FET having a drain, a source, a gate, a $V_{DS}$ characteristic, a $V_{GS}$ characteristic, and a signal path through the FET between the drain and the source; and a switch coupled to the signal path of the FET, configured to switchably couple the signal path to a normal current flow path or to a trickle current path; wherein, in an active mode, the switch couples the signal path of the FET to the normal current flow path; and wherein, in a standby mode, the switch couples the signal path of the FET to the trickle current path such that both the $V_{GS}$ characteristic and the $V_{DS}$ characteristic of the FET are close to respective active mode operational voltages for the $V_{GS}$ characteristic and the $V_{DS}$ characteristic, thereby reducing changes in accumulated charge in or near SOI substrate and/or any the trap rich layer and/or elsewhere in the FET (e.g., at the gate, drain, or source of the FET). The trickle current path may have a high resistance relative to the normal current flow path, and/or the trickle current path may include a regulated current source that allows only a trickle of current to flow through the FET relative to the normal current flow path.

Trickle Current Circuit Applications

The trickle current circuits shown in FIGS. 7A-7D can be used in a wide variety of applications. For example, FIG. 8 is a schematic diagram of a current mirror circuit 800 for providing a reference current $V_{BG}/R$, such as to the bias generator circuit 206 of FIG. 2. Based on the PFET circuit of FIG. 7A, a differential amplifier 802 provides an essentially constant bias voltage $V_{BIAS}$ to M1 and to a current mirror PFET, M2, based on comparing a reference voltage $V_{BG}$ to the voltage at the drain of M1, $V_{SENSE}$. In both cases, a load (resistance) is switched to a much higher value in the standby mode.

Figure 1:
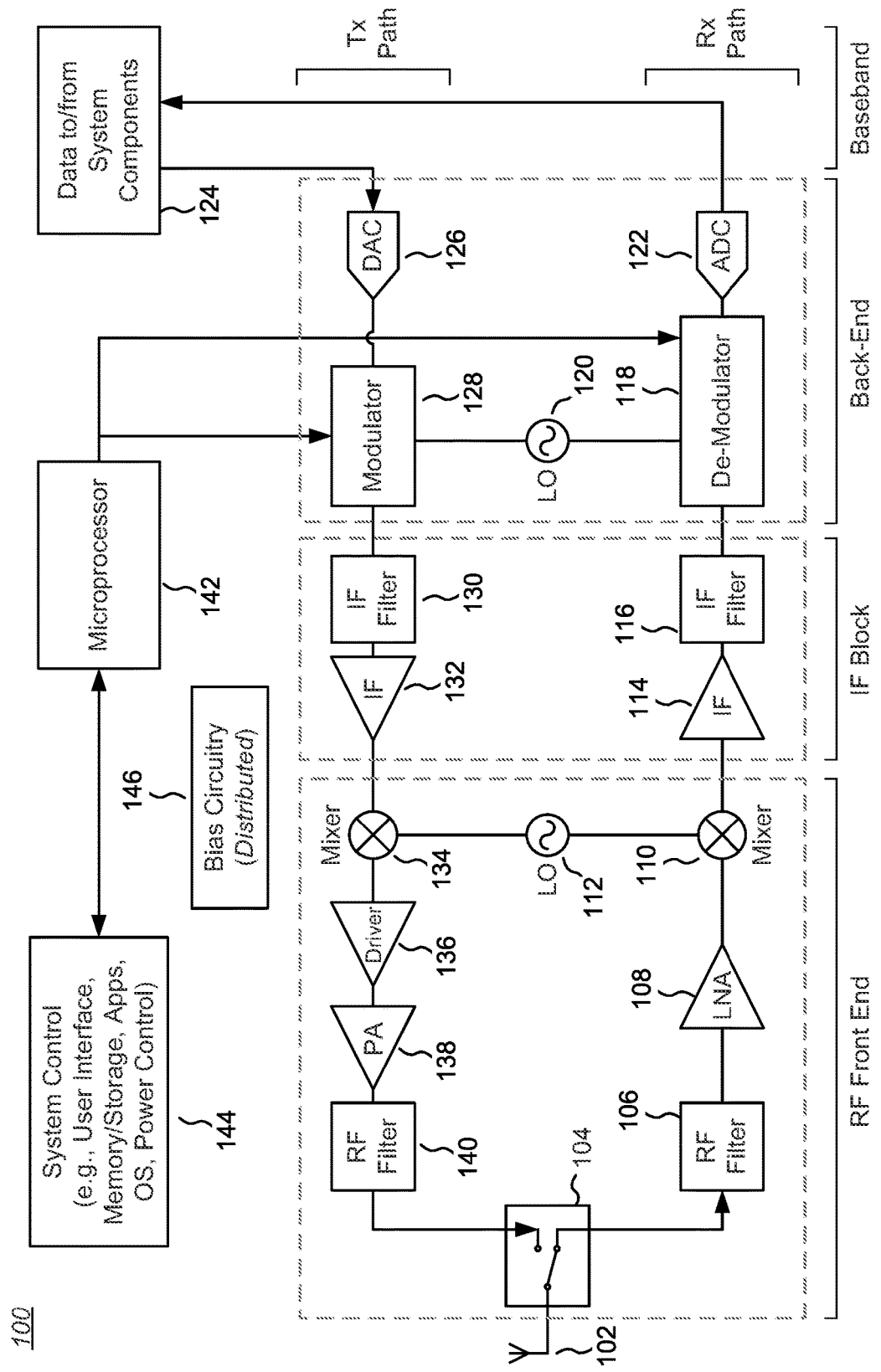
FIG. 1 is a block diagram of a typical prior art transceiver such as the type that might be used in a cellular telephone.
Figure 2:
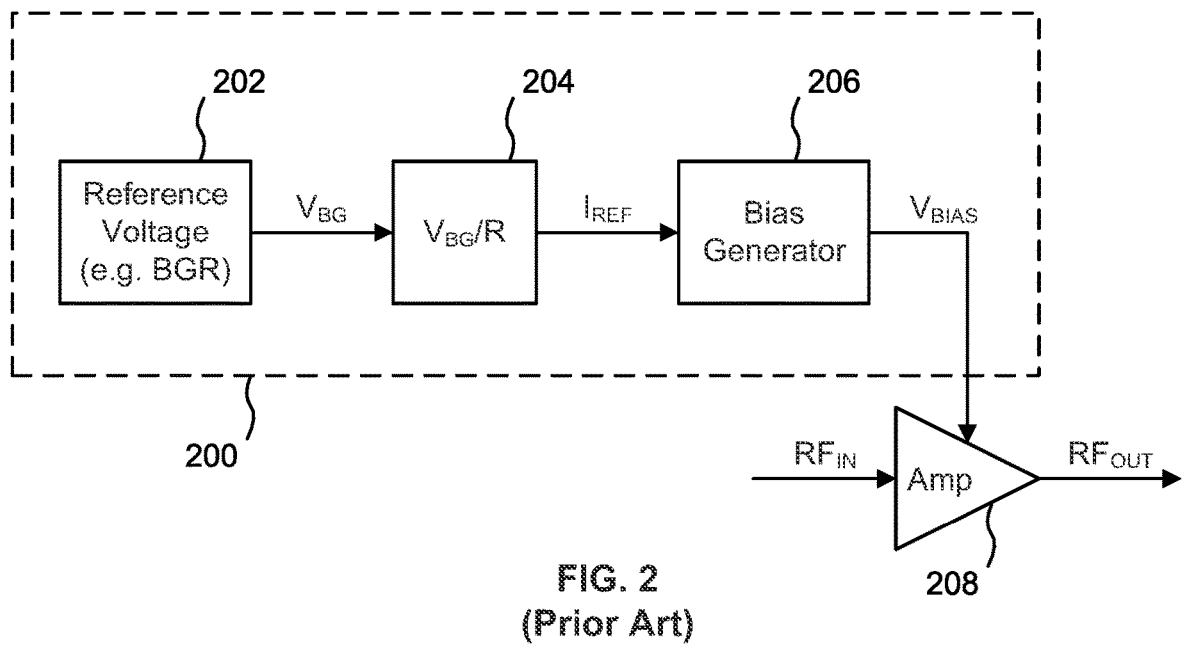
FIG. 2 is a block diagram of a prior art bias voltage generation circuit.
Figure 3:
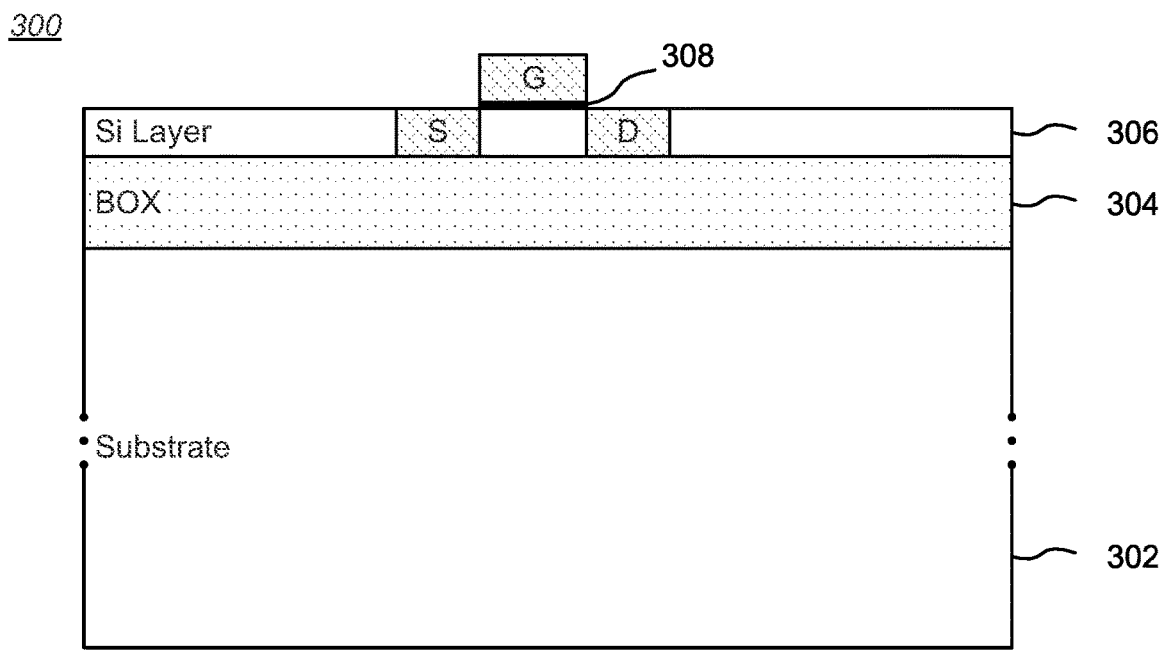
FIG. 3 is block diagram showing a typical prior art SOI IC structure for a single FET.

As in FIG. 2, the reference voltage $V_{BG}$ may be, for example, a band-gap voltage reference. As in the example of FIG. 7A, the current mirror circuit 800 can be switched between an active mode (with M1 coupled to resistance R through switch S1) and a trickle current standby mode (with M1 coupled to higher resistance $R_{SB}$ through switch S1).

Figure 9A:
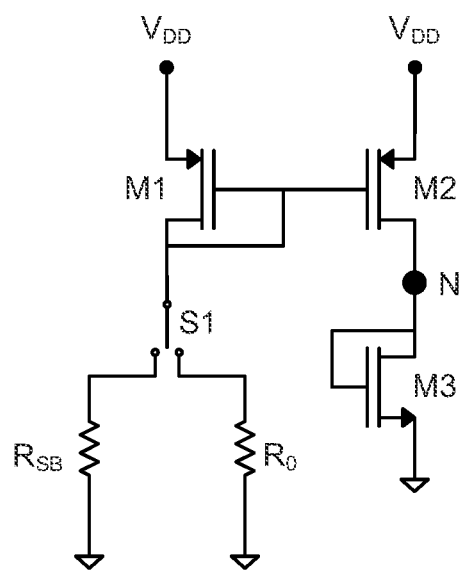
FIG. 9A is a schematic diagram of a current mirror circuit based on the PFET circuit of FIG. 7A.
Figure 9B:
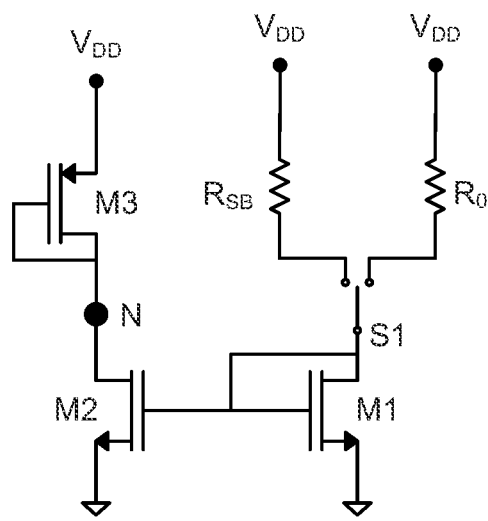
FIG. 9B is a schematic diagram of a current mirror circuit based on the NFET circuit of FIG. 7B.

FIG. 9A is a schematic diagram of a current mirror circuit 900 based on the PFET circuit of FIG. 7A. FIG. 9B is a schematic diagram of a current mirror circuit 920 based on the NFET circuit of FIG. 7B. In each configuration, FET M1 is self-biased to function as a diode and provides a bias voltage to current mirror FET M2, which is typically sized to be significantly larger than M1 by a scaling factor m; for example, in some embodiments, m=100. In each configuration, FET M3 represents an example load, or a replica device for a power amplifier. A usable voltage is provided at a respective node N, which may be coupled to other circuitry downstream (not shown); for example, each configuration may be useful for biasing a power amplifier FET stack or a low-noise amplifier (LNA) from node N.

In either case, in the low power standby mode (i.e., $R_{SB}$ is switched into circuit by S1), normal bias current is replaced with a trickle current. The trickle current reduces the voltage change on each FET gate (for example, compared to pulling a gate to ground) when switching between the active mode and the standby mode. The trickle current also reduces voltage changes on FET drains if the normal-mode loads remain connected. Note that many more current mirror stages may be connected to M2, and each will remain in the preferred low power state as well when $R_{SB}$ is switched into circuit by S1.

Figure 10:
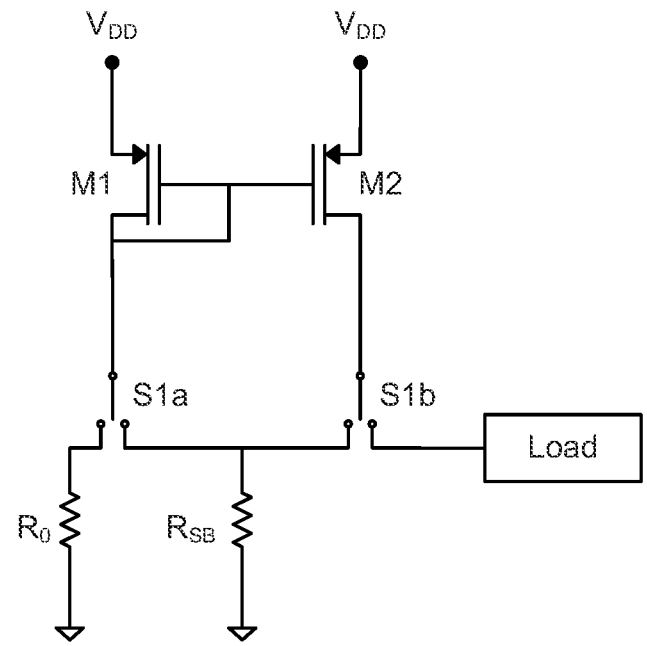
FIG. 10 is a schematic diagram of a current mirror circuit based on the PFET circuit of FIG. 7A having matching drain characteristics.

FIG. 10 is a schematic diagram of a current mirror circuit having matching drain characteristics. In this example, two SPDT switches, S1a and S1b, are configured to switch in unison (but in opposite directions for the circuit as drawn; both switches are drawn as being in a neutral position but are generally binary). PFET M1 is self-biased to function as a diode. In the normal mode, the drain of PFET M1 is coupled to R0 through S1a, and the drain of current mirror PFET M2 is coupled to a Load through S1b. In the standby mode, the drain of M1 is coupled to $R_{SB}$ through S1a and the drain of M2 is coupled to $R_{SB}$ through S1b, thus shorting the drains together.

Shorting the drains together in the low power standby mode limits additional SOI substrate coupling effects because the two FETs act as one device, which means their terminal voltages match and current densities are the same (ignoring possible device mismatch). Upon return to the active mode, the FETs will have the same starting conditions for $V_{DS}$ and $V_{GS}$, which helps active mode current accuracy and settling time (note that the active mode configuration may include a feedback loop, not shown).

In some configurations, separate resistances (e.g., $R_{SB}$a and $R_{SB}$b) corresponding to switches S1a and S1b may be used to better match the trickle current requirements of other circuitry (not shown) coupled to M1 and/or M2. As one of ordinary skill in the art would understand, the concepts illustrated in FIG. 10 are extensible to NFETs.

Figure 11:
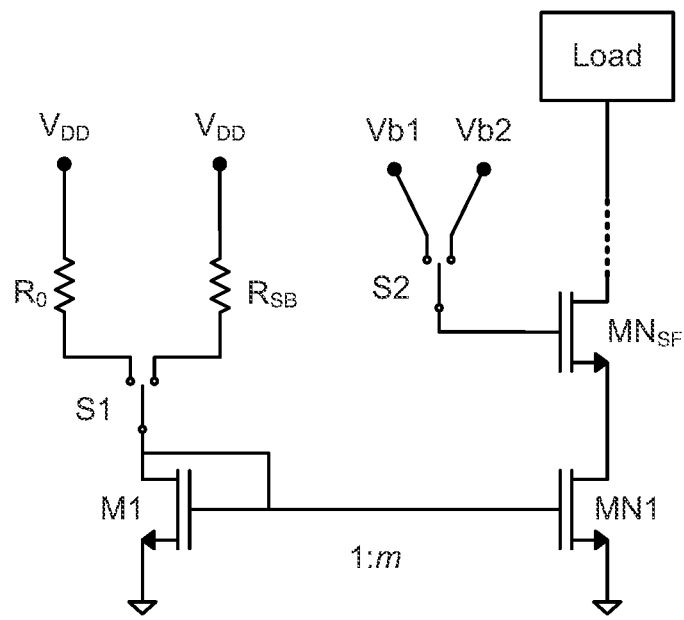
FIG. 11 is a schematic diagram of a bias circuit based on the NFET circuit of FIG. 7B used in conjunction with a variable bias source-follower circuit.

FIG. 11 is a schematic diagram of a bias circuit based on the NFET circuit of FIG. 7B used in conjunction with a variable bias source-follower circuit. NFET M1 is self-biased to function as a diode and provides a bias voltage to NFET MN1, which is typically sized to be significantly larger than M1 by a scaling factor m. In this example, the drain of MN1 is controlled by a source-follower NFET $MN_{SF}$ coupled to a Load. Actual implementations may use stacks of two or more source-follower stages instead of one, as suggested by the dotted line connecting the single illustrated NFET $MN_{SF}$ to the Load.

The function of switch S1 is as described above for FIG. 7B, coupling resistance $R_0$ to M1 in the active mode and coupling much higher resistance $R_{SB}$ to M1 in the standby mode. In the illustrated example, as an added feature, the bias voltage to the gate of $MN_{SF}$ may also be varied by mode by controlling switch S2 in unison with switch S1 (both switches are drawn as being in a neutral position but are generally binary). In the active mode, switch S2 would be set to supply a normal bias voltage Vb1 to the gate of $MN_{SF}$. However, in the standby mode, switch S2 would be set to supply a lower bias voltage Vb2 to the gate of $MN_{SF}$. The lower bias voltage Vb2 would keep the drain voltage of MN1 closer to where it would be in the active mode (e.g., just above $V_{TH}$ for NFET MN1), thereby reducing changes in accumulated charge.

Figure 12:
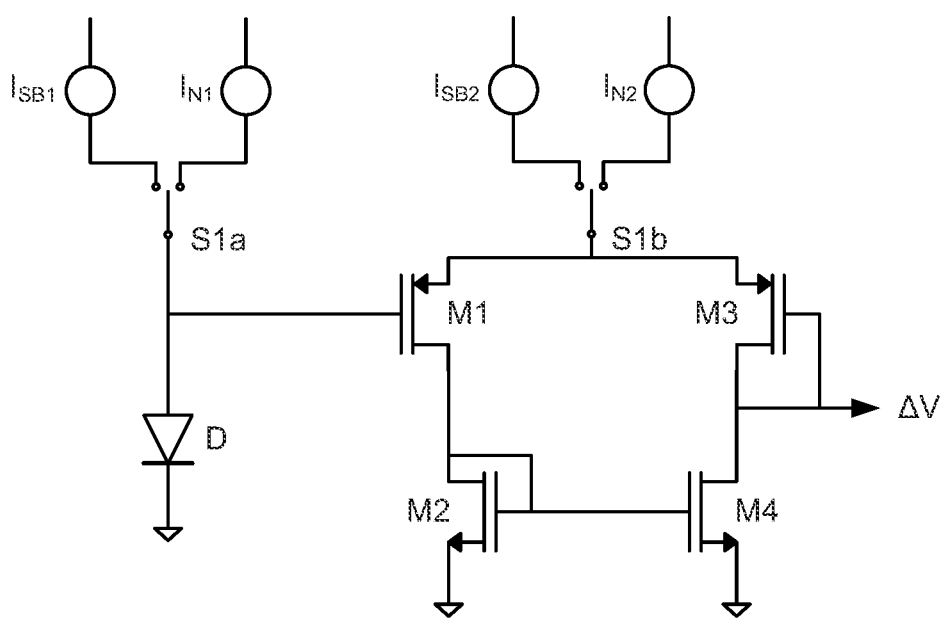
FIG. 12 is a schematic diagram of a bias circuit based on the NFET circuit of FIG. 7C used in conjunction with a current mirror having a variable current source.

FIG. 12 is a schematic diagram of a bias circuit based on the NFET circuit of FIG. 7C used in conjunction with a current mirror having a variable current source. Standby mode current source $I_{SB1}$ and active mode current source $I_{N1}$ can be coupled by a switch S1a to a diode D. Similarly, standby mode current source $I_{SB2}$ and active mode current source $I_{N2}$ can be coupled by a switch S1b to the sources of PFETS M1 and M3. Switches S1a, S1b are drawn as being in a neutral position but are generally binary, and both are configured to switch in unison. PFET M1 is biased by the diode D, and is series coupled to NFET M2, which is self-biased to function as a diode and provides a bias voltage to NFET M4. PFET M3 is self-biased to function as a diode and is series coupled to NFET M4. The output ΔV between M3 and M4 may be used to bias power amplifier circuitry (not shown).

In the normal mode, switches S1a and S1b couple normal current sources $I_{N1}$ and $I_{N2}$ in-circuit. In the standby mode, switches S1a and S1b couple low power current sources Ism and $I_{SB2}$ in-circuit. In the illustrated configuration, to prevent large voltage changes on amplifier input (i.e., large ΔV) when switching between the standby and active modes, the input to the diode D remains biased with a trickle current in the low power standby mode, rather than being discharged to ground.

Summary of Embodiments

More generally, embodiments of the invention encompass an integrated circuit susceptible to accumulated charge and fabricated on an SOI substrate, including: at least one FET having a $V_{DS}$ characteristic and a $V_{GS}$ characteristic, and at least one switch coupled to the FET and configured to be set to a standby mode in which no more than a trickle current flows through the at least one FET while maintaining essentially the same $V_{DS}$ characteristic and $V_{GS}$ characteristic for the at least one FET as during an active mode, thereby eliminating or reducing changes in accumulated charge. Further, one or more of the embodiments described above may be used in the same IC.

Substrate Stabilization

Additional techniques may optionally be used in conjunction with embodiments of the circuits described above. For example, in some embodiments, it may be useful to create protected areas on an SOI substrate that encompass FETs that are sensitive to accumulated charge effects by surrounding such areas with substrate contacts (S-contacts), such as the type of S-contacts taught in U.S. patent application Ser. No. 14/964,412 referenced above.

An S-contact in the context of an IC structure is a path which provides a resistive conduction path between a contact region at a surface of a layer of the IC structure and a contact region at or near a surface of a high resistivity substrate of the IC structure (high resistivity includes a range of 3,000 to 20,000 or higher ohm-cm; as known to a person skilled in the art, standard SOI process uses substrates with a low resistivity, typically below 1,000 ohm-cm).

Figure 4:
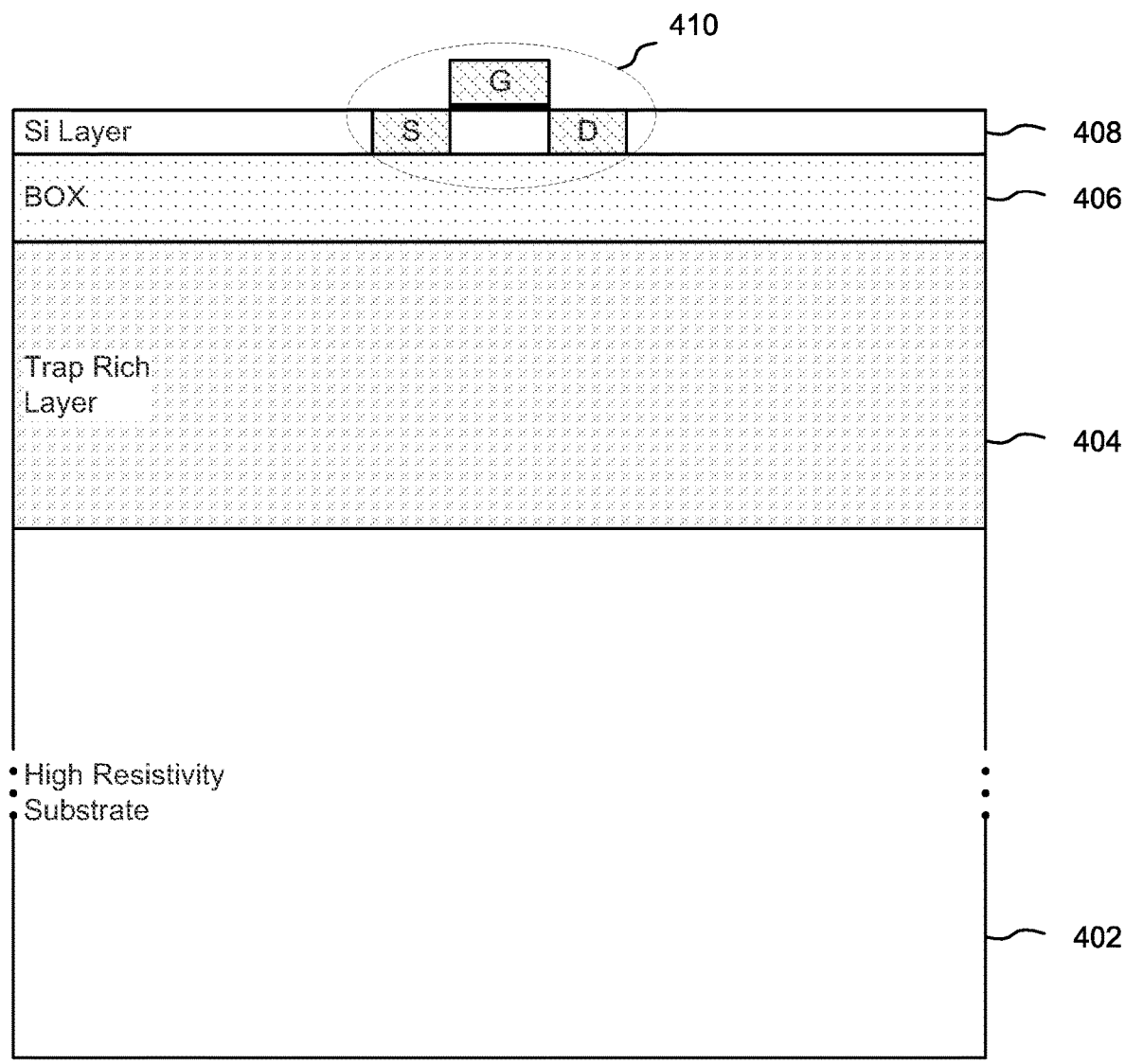
FIG. 4 is block diagram showing an improved prior art SOI IC structure for a single FET.
Figure 13:
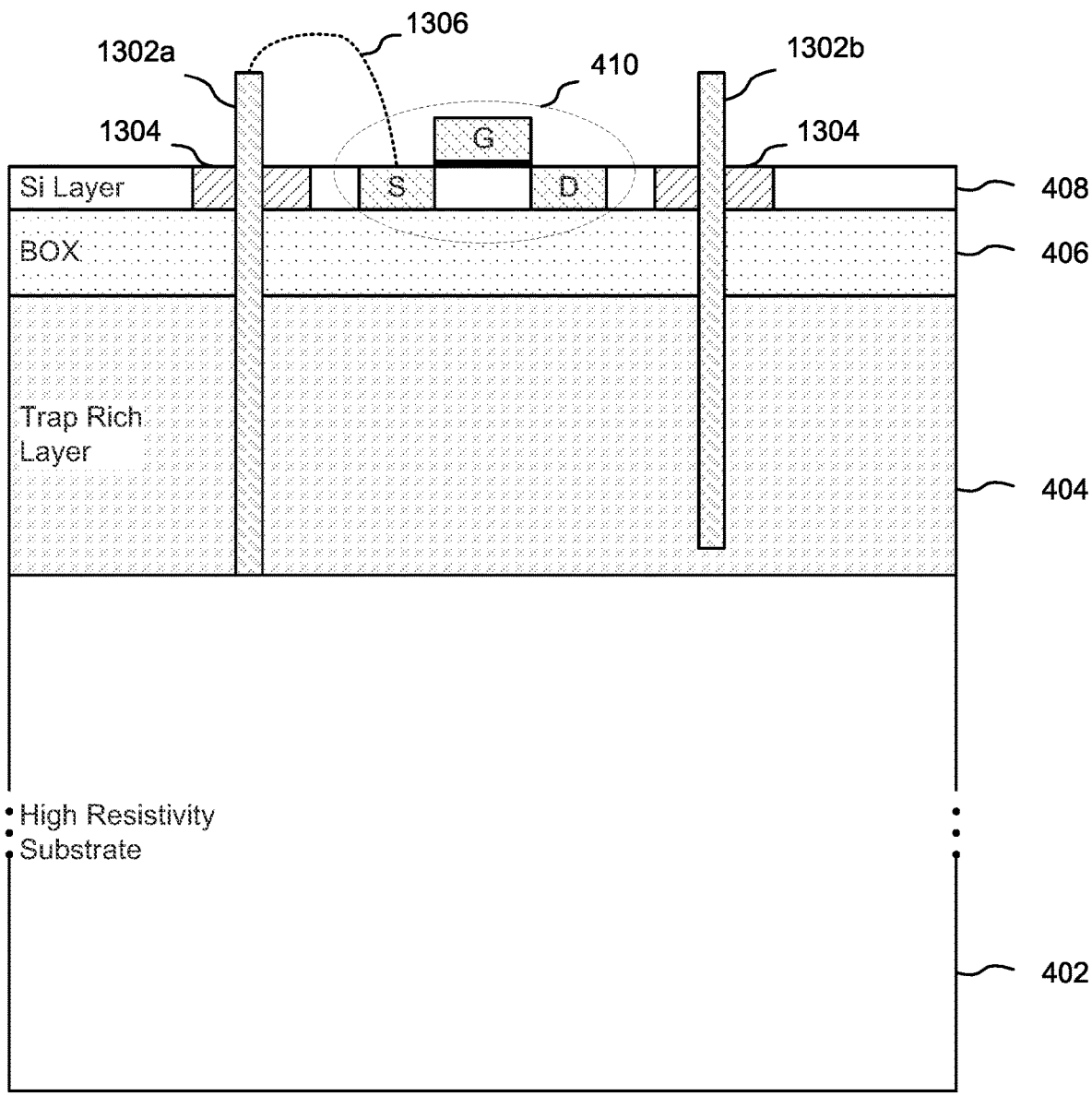
FIG. 13 is block diagram showing an SOI IC structure with a trap rich layer, a BOX insulator layer, and substrate contacts for a single FET.

For example, FIG. 13 is block diagram showing an SOI IC structure 1300 with a trap rich layer 404, a BOX insulator layer 406, and substrate contacts for a single FET 410. In the illustrated embodiment, which is otherwise similar to FIG. 4, two S-contacts 1302a, 1302b penetrate through corresponding isolation regions 1304 from the active layer 408 to or near the upper surface of the high resistivity substrate 402. The material used for the S-contacts 1302a, 1302b can be any low resistivity conductive material, such as polysilicon and various metals (e.g., tungsten, copper, etc.). In the case of an SOI device, the isolation regions 1304 can be shallow trench isolation (STI) regions. By virtue of penetrating through the isolation regions 1304 within the active layer 408, the S-contacts 1302a, 1302b remain isolated from direct contact with other active regions of the active layer 408. In common practice, the S-contacts 1302a, 1302b are electrically connected, directly or through other circuit elements, to the source S or the gate G of a FET 410; one possible electrical connection is shown by a dotted line 1306 from the source S of the FET 410 to one S-contact 1302a (other possible contacts are not shown here, but are illustrated in U.S. patent application Ser. No. 14/964,412 referenced above). However, as discussed below, the S-contacts 1302a, 1302b may electrically connected to circuit ground or to another known potential.

In the case of SOI substrates having a trap rich layer 404, as shown in FIG. 13, an S-contact 1302a can penetrate through the trap rich layer 404 to make direct contact with the high resistivity substrate 402. Alternatively, since the trap rich layer 404 has some conductivity (and may be as conductive as the high resistivity substrate 402), in some applications an S-contact 1302b can make a resistive contact with the high resistivity substrate 402 by contacting the surface of the trap rich layer 404. In other applications, an S-contact 1302b can penetrate the trap rich layer 404 to a depth sufficient enough to make a resistive contact, through a remaining portion of the thickness of the trap rich layer 404, with the high resistivity substrate 402.

Figure 14:
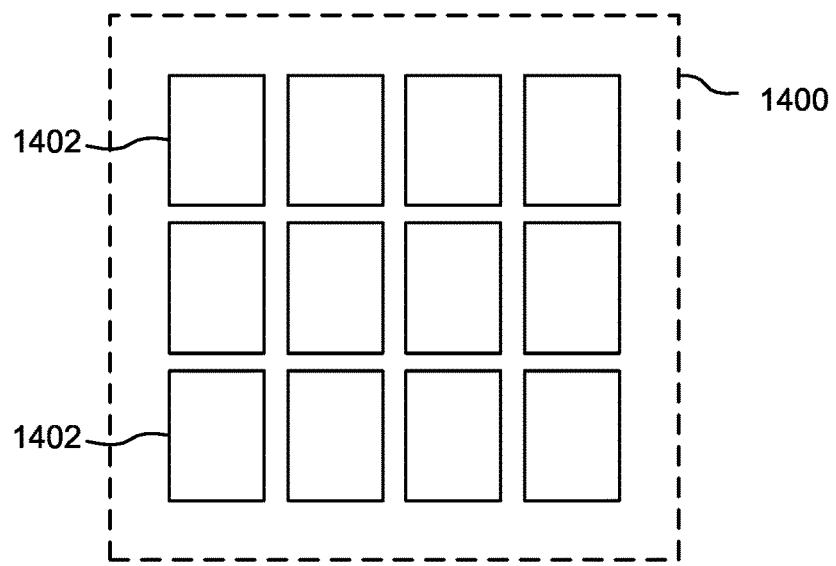
FIG. 14 is a top plan view of an area of a stylized IC that includes twelve example circuits (e.g., current mirrors for bias circuits of a power amplifier).
Figure 15:
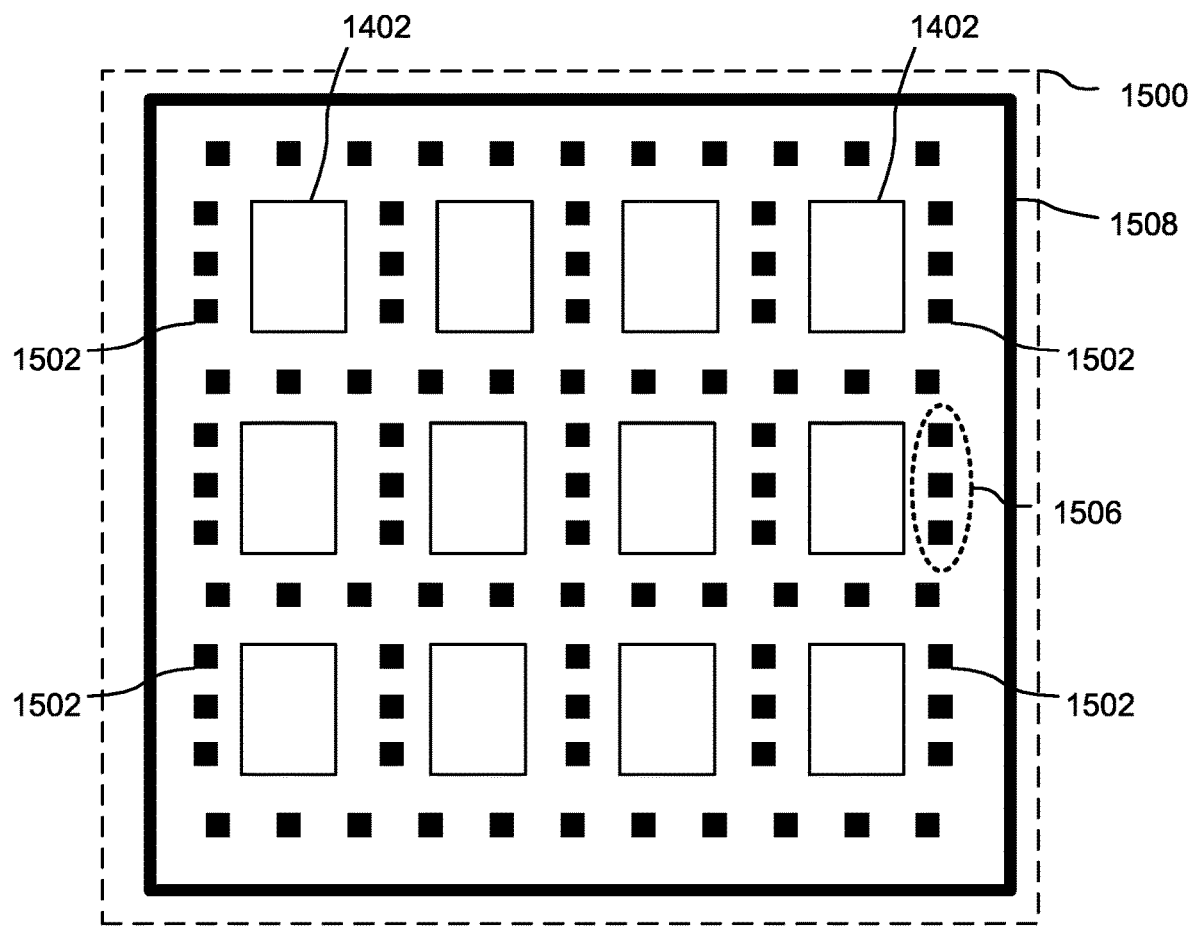
FIG. 15 is a top plan view of an area of a stylized IC that includes twelve example circuits surrounded by a plurality of S-contacts.

In addition to the purposes taught in U.S. patent application Ser. No. 14/964,412 referenced above, S-contacts can be used in conjunction with embodiments of the invention (such as the embodiments described above) to create protected areas on an IC substrate that encompass FETs that are sensitive to accumulated charge effects. For example, FIG. 14 is a top plan view of an area 1400 of a stylized IC that includes twelve example circuits 1402 of a type susceptible to accumulated charge resulting from the interaction of an unmodified trap rich layer 404 and transient changes of state of FETs comprising such circuits (e.g., current mirrors for bias circuits of a power amplifier). FIG. 15 is a top plan view of an area 1500 of a stylized IC that includes the twelve example circuits 1402 of FIG. 14 surrounded by a plurality of S-contacts 1502. As illustrated, S-contacts 1502 substantially surround each circuit 1402, essentially creating corresponding "wells" surrounded by S-contact "rings" (even though not circular). The rings of S-contacts 1502 around the wells reduce substrate impedance and thus settling time of the substrate voltage under the circuits 1402, help in shielding the circuits 1402 from electrical interference (from each other and from other circuits outside the area 1500), help in draining accumulated charge from the high resistivity substrate 402 and/or trap rich layer 404, and help to improve impedance matching for the circuits 1402 within the wells by preventing uneven substrate potential between circuits. However, even a single S-contact near a circuit 1402 may provide a benefit.

Each of the S-contacts 1502 may be electrically connected, directly or through other circuit elements, to the source S or the gate G of a FET. However, when used with embodiments of the present invention, it may be quite beneficial to connect the S-contacts 1502 to circuit ground or to another known potential (even the IC supply voltage, $V_{DD}$), to avoid imposing signals on the S-contacts 1502. Such imposed signals may create accumulated charge in the high resistivity substrate 402 and/or in or near the trap layer 404 and/or elsewhere in the FET (e.g., at the gate, drain, or source of the FET), and may arise, e.g., due to varying voltages applied to active layer 408 elements, such as the source S or gate G of a FET. While a static potential may be most beneficial in some applications, in other applications it may be useful to dynamically change the potential applied to the S-contacts 1502, such as by raising or lowering an applied voltage to counteract accumulated charge that arises during some operational phases (e.g., bursts of signal transmissions in an active mode versus essentially quiescent periods during a standby mode). In some applications, it may be useful to purposefully inject charge into the high resistivity substrate 402 and/or the trap layer 404 by biasing the S-contacts 1502 with a suitable voltage signal. When a potential other than circuit ground is desired, it may be useful use a charge pump or similar means to inject offsetting charge, or apply a negative potential, or apply a positive potential that exceeds the voltage of the IC power supply (e.g., greater than $V_{DD}$).

The size, number, and spacing of the S-contacts 1502 generally is a matter of design choice. However, to improve transient effects, wells defined by the S-contacts 1502 should be small enough such that there are essentially no gradients under large circuits 1402 that might necessitate additional impedance matching. Accordingly, the size of the S-contact rings should be similar in size to the wells of potential formed by the S-contacts. Note that complete encirclement of each circuit 1402 may not be necessary in all applications, and that a partial ring of S-contacts may suffice. For example, S-contacts may be omitted in some applications for edges of circuits 1402 not shared with other close-by circuits 1402, such as the S-contacts shown within the dotted oval 1506 of FIG. 15. Moreover, while individual "island" type S-contacts 1502 are illustrated in FIG. 15, S-contacts can be formed as trenches, in known fashion.

If the S-contacts 1502 are biased in some manner, it may be useful to form a guard ring 1508 of S-contacts around the area 1500 to protect other circuitry; S-contact trenches would work particularly well for such a guard ring 1508, which typically would be grounded.

In addition to the methods taught in U.S. patent application Ser. No. 14/964,412 referenced above, a person skilled in the art will know of many fabrication methods to provide S-contacts suitable for the purposes described in this disclosure.

Methods

Another aspect of the invention includes methods for eliminating or reducing changes in accumulated charge in an integrated circuit susceptible to accumulated charge and fabricated on a silicon-on-insulator (SOI) substrate (particularly an SOI substrate having a trap rich layer), and for eliminating or reducing changes in accumulated charge in a circuit fabricated on an SOI substrate (particularly an SOI substrate having a trap rich layer) as part of an integrated circuit susceptible to accumulated charge. Following are a number of examples of such methods.

Figure 16:
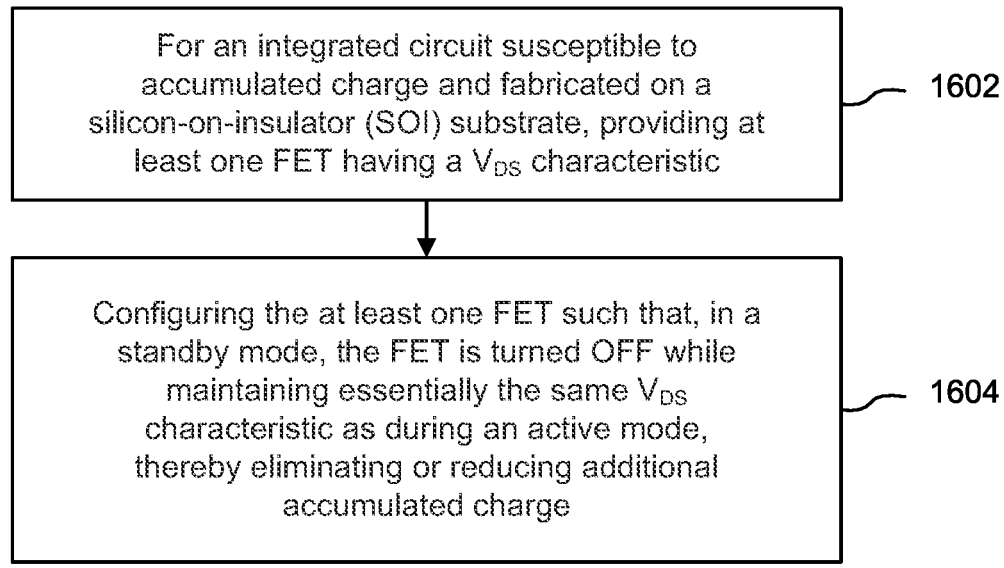
FIG. 16 is a process flow diagram showing a first method for eliminating or reducing changes in accumulated charge in an integrated circuit susceptible to accumulated charge and fabricated on a silicon-on-insulator (SOI) substrate.

FIG. 16 is a process flow diagram 1600 showing a first method for eliminating or reducing changes in accumulated charge in an integrated circuit susceptible to accumulated charge and fabricated on a silicon-on-insulator (SOI) substrate, including: providing at least one field effect transistor (FET) having a $V_{DS}$ characteristic (STEP 1602); and configuring the at least one FET such that, in a standby mode, the FET is turned OFF while maintaining essentially the same $V_{DS}$ characteristic as during an active mode, thereby eliminating or reducing changes in accumulated charge (STEP 1604).

Figure 17:
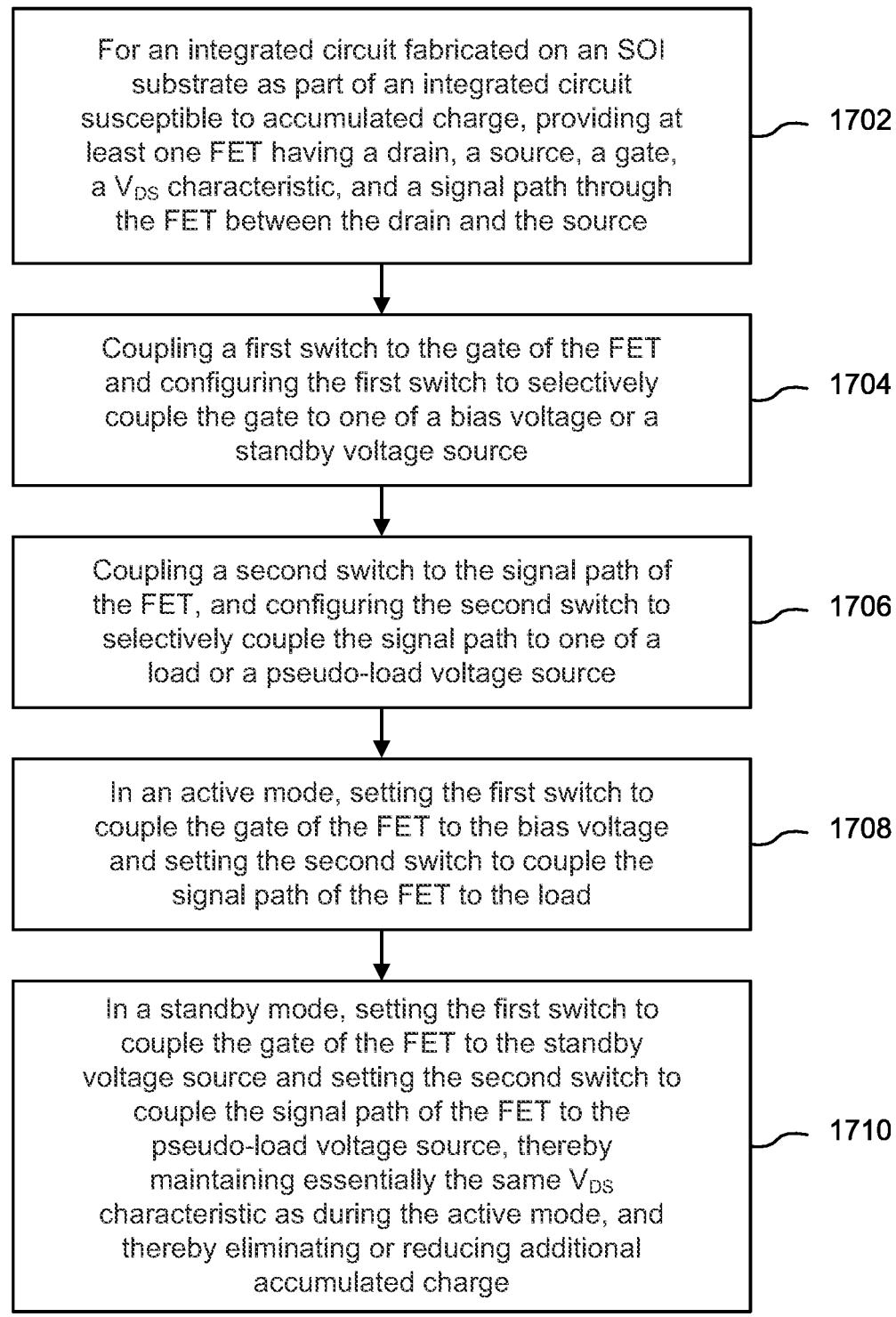
FIG. 17 is a process flow diagram showing a second method for eliminating or reducing changes in accumulated charge in an integrated circuit fabricated on an SOI substrate as part of an integrated circuit susceptible to accumulated charge.

FIG. 17 is a process flow diagram 1700 showing a second method for eliminating or reducing changes in accumulated charge in an integrated circuit fabricated on an SOI substrate as part of an integrated circuit susceptible to accumulated charge, including: providing at least one FET having a drain, a source, a gate, a $V_{DS}$ characteristic, and a signal path through the FET between the drain and the source (STEP 1702); coupling a first switch to the gate of the FET and configuring the first switch to selectively couple the gate to one of a bias voltage or a standby voltage source (STEP 1704); coupling a second switch to the signal path of the FET, and configuring the second switch to selectively couple the signal path to one of a load or a pseudo-load voltage source (STEP 1706); in an active mode, setting the first switch to couple the gate of the FET to the bias voltage and setting the second switch to couple the signal path of the FET to the load (STEP 1708); and in a standby mode, setting the first switch to couple the gate of the FET to the standby voltage source and setting the second switch to couple the signal path of the FET to the pseudo-load voltage source, thereby maintaining essentially the same $V_{D}S$ characteristic as during the active mode, and thereby eliminating or reducing changes in accumulated charge (STEP 1710).

Figure 18:
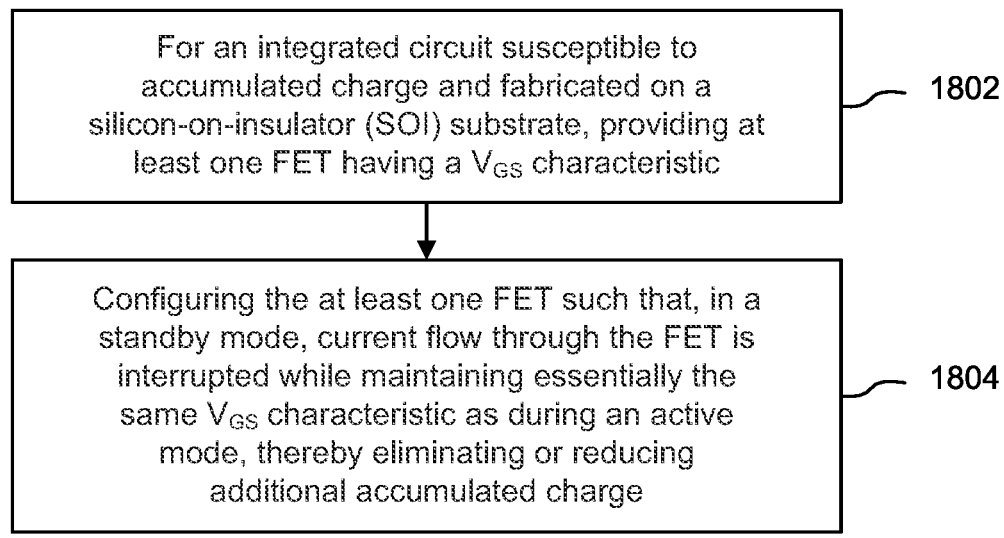
FIG. 18 is a process flow diagram showing a third method for eliminating or reducing changes in accumulated charge in an integrated circuit susceptible to accumulated charge and fabricated on an SOI substrate.

FIG. 18 is a process flow diagram 1800 showing a third method for eliminating or reducing changes in accumulated charge in an integrated circuit susceptible to accumulated charge and fabricated on an SOI substrate, including: providing at least one FET having a $V_{GS}$ characteristic (STEP 1802); and configuring the at least one FET such that, in a standby mode, current flow through the FET is interrupted while maintaining essentially the same $V_{GS}$ characteristic as during an active mode, thereby eliminating or reducing changes in accumulated charge (STEP 1804).

Figure 19:
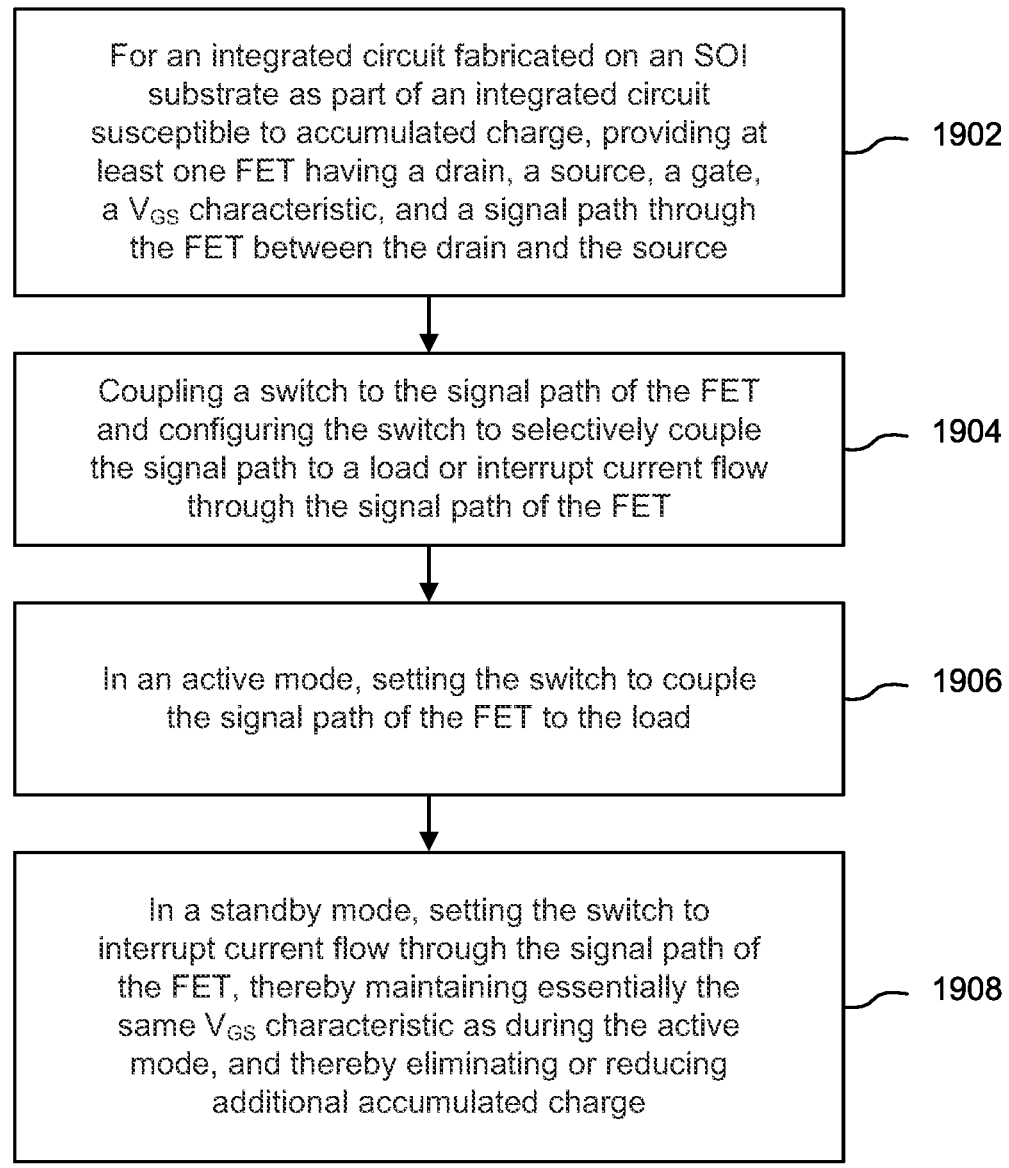
FIG. 19 is a process flow diagram showing a fourth method for eliminating or reducing changes in accumulated charge in an integrated circuit fabricated on an SOI substrate as part of an integrated circuit susceptible to accumulated charge.

FIG. 19 is a process flow diagram 1900 showing a fourth method for eliminating or reducing changes in accumulated charge in an integrated circuit fabricated on an SOI substrate as part of an integrated circuit susceptible to accumulated charge, including: providing at least one FET having a drain, a source, a gate, a $V_{GS}$ characteristic, and a signal path through the FET between the drain and the source (STEP 1902); coupling a switch to the signal path of the FET and configuring the switch to selectively couple the signal path to a load or interrupt current flow through the signal path of the FET (STEP 1904); in an active mode, setting the switch to couple the signal path of the FET to the load (STEP 1906); and in a standby mode, setting the switch to interrupt current flow through the signal path of the FET, thereby maintaining essentially the same $V_{GS}$ characteristic as during the active mode, and thereby eliminating or reducing changes in accumulated charge (STEP 1908).

FIG. 20 is a process flow diagram 2000 showing a fifth method for eliminating or reducing changes in accumulated charge in an integrated circuit susceptible to accumulated charge and fabricated on an SOI substrate, including: providing at least one FET having a drain, a source, a gate, a $V_{DS}$ characteristic, a $V_{GS}$ characteristic, and a signal path through the FET between the drain and the source (STEP 2002); and configuring the at least one FET such that, in a standby mode, the FET is switched into a very low current state with respect to current flow through the signal path that keeps both the $V_{GS}$ characteristic and the $V_{DS}$ characteristic of the FET close to respective active mode operational voltages for the $V_{GS}$ characteristic and the $V_{DS}$ characteristic, thereby reducing changes in accumulated charge (STEP 2004).

Figure 21:
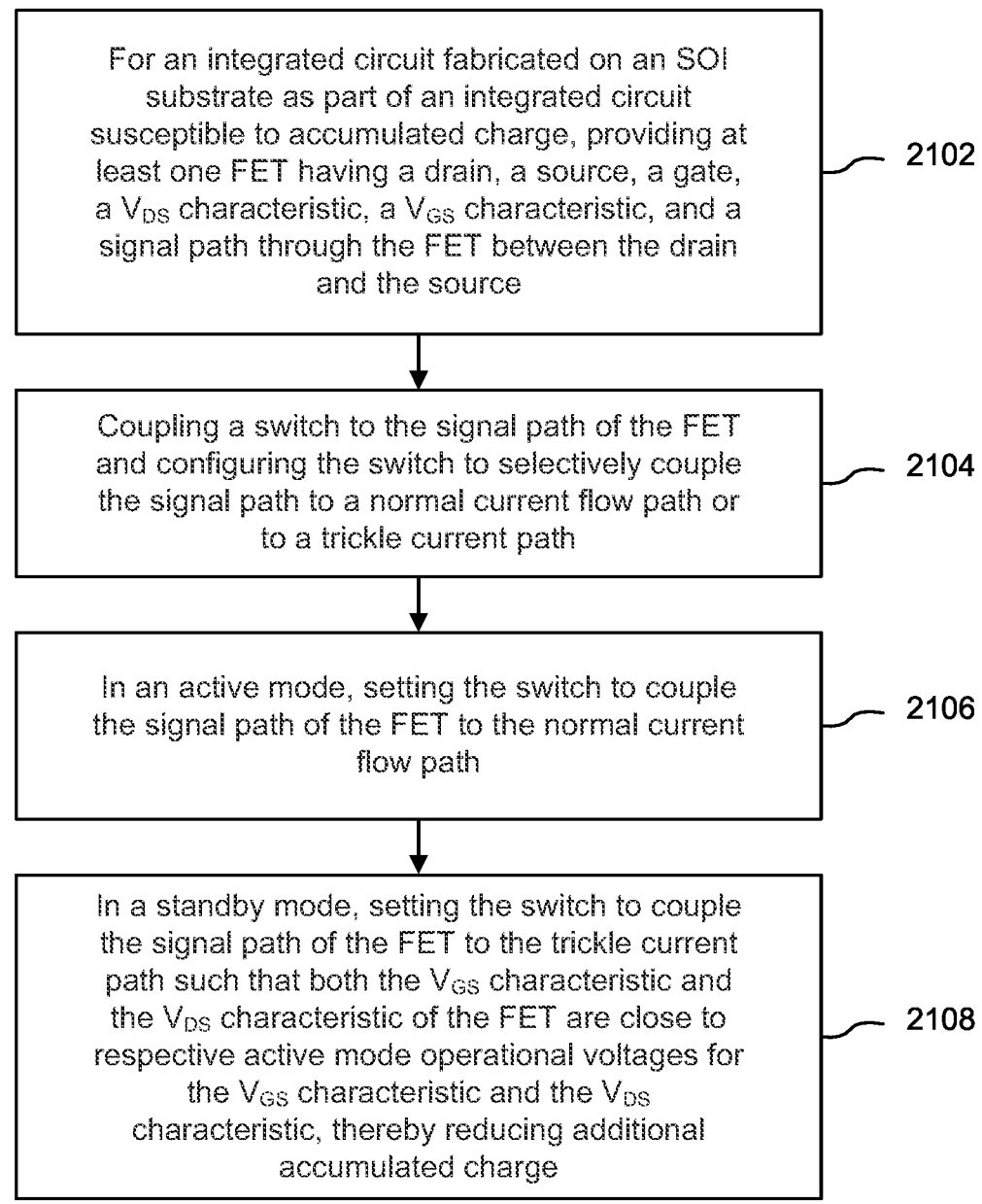
FIG. 21 is a process flow diagram showing a sixth method for eliminating or reducing changes in accumulated charge in an integrated circuit fabricated on an SOI substrate as part of an integrated circuit susceptible to accumulated charge.

FIG. 21 is a process flow diagram 2100 showing a sixth method for eliminating or reducing changes in accumulated charge in an integrated circuit fabricated on an SOI substrate as part of an integrated circuit susceptible to accumulated charge, including: providing at least one FET having a drain, a source, a gate, a $V_{DS}$ characteristic, a $V_{GS}$ characteristic, and a signal path through the FET between the drain and the source (STEP 2102); coupling a switch to the signal path of the FET and configuring the switch to selectively couple the signal path to a normal current flow path or to a trickle current path (STEP 2104); in an active mode, setting the switch to couple the signal path of the FET to the normal current flow path (STEP 2106); and in a standby mode, setting the switch to couple the signal path of the FET to the trickle current path such that both the $V_{GS}$ characteristic and the $V_{DS}$ characteristic of the FET are close to respective active mode operational voltages for the $V_{GS}$ characteristic and the $V_{DS}$ characteristic, thereby reducing changes in accumulated charge (STEP 2108).

Figure 22:
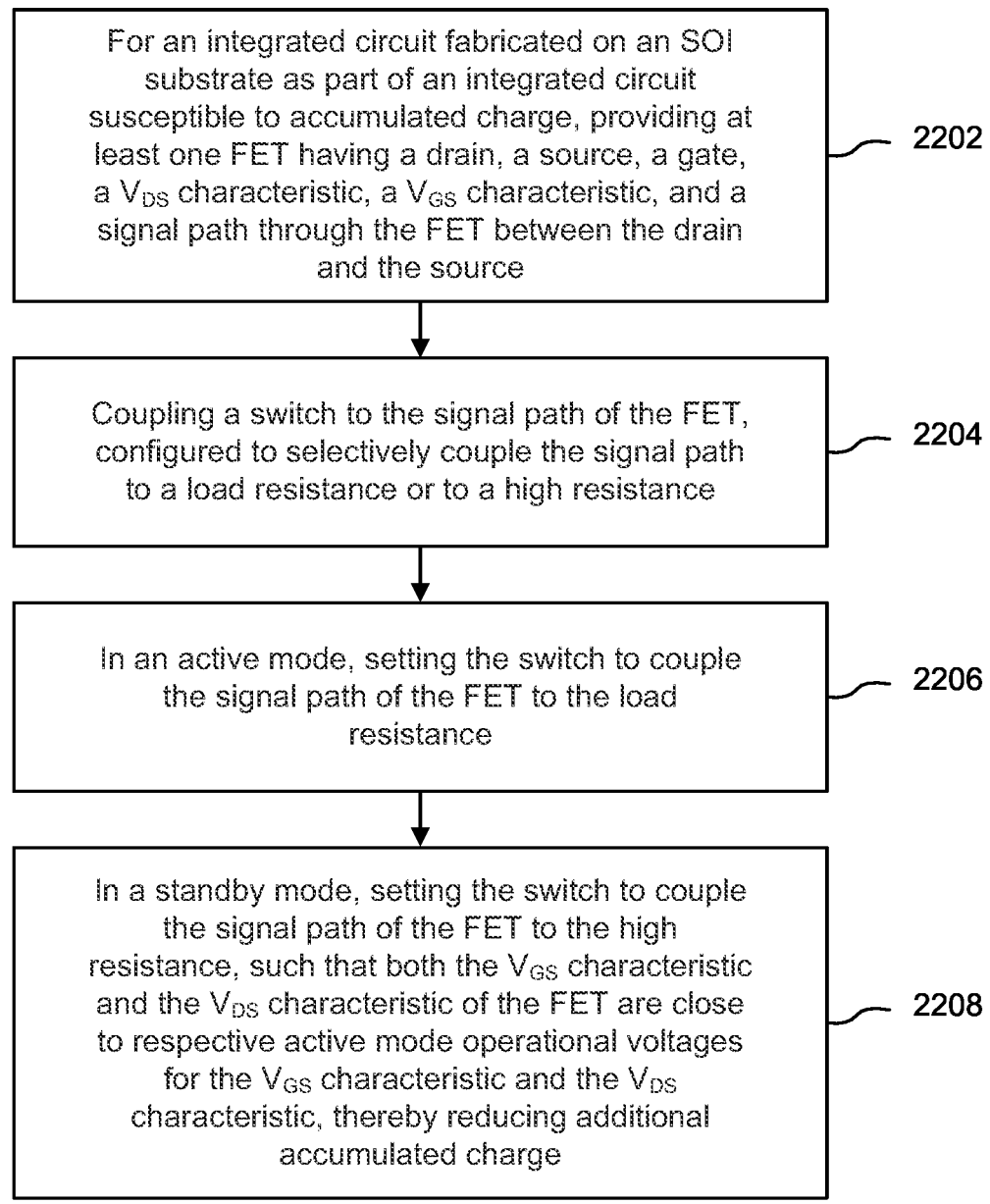
FIG. 22 is a process flow diagram showing a seventh method for eliminating or reducing changes in accumulated charge in an integrated circuit fabricated on an SOI substrate as part of an integrated circuit susceptible to accumulated charge.

FIG. 22 is a process flow diagram 2200 showing a seventh method for eliminating or reducing changes in accumulated charge in an integrated circuit fabricated on an SOI substrate as part of an integrated circuit susceptible to accumulated charge, including: providing at least one FET having a drain, a source, a gate, a $V_{DS}$ characteristic, a $V_{GS}$ characteristic, and a signal path through the FET between the drain and the source (STEP 2202); coupling a switch to the signal path of the FET, configured to selectively couple the signal path to a load resistance or to a high resistance (STEP 2204); in an active mode, setting the switch to couple the signal path of the FET to the load resistance (STEP 2206); and in a standby mode, setting the switch to couple the signal path of the FET to the high resistance, such that both the $V_{GS}$ characteristic and the $V_{DS}$ characteristic of the FET are close to respective active mode operational voltages for the $V_{GS}$ characteristic and the $V_{DS}$ characteristic, thereby reducing changes in accumulated charge (STEP 2208).

Figure 23:
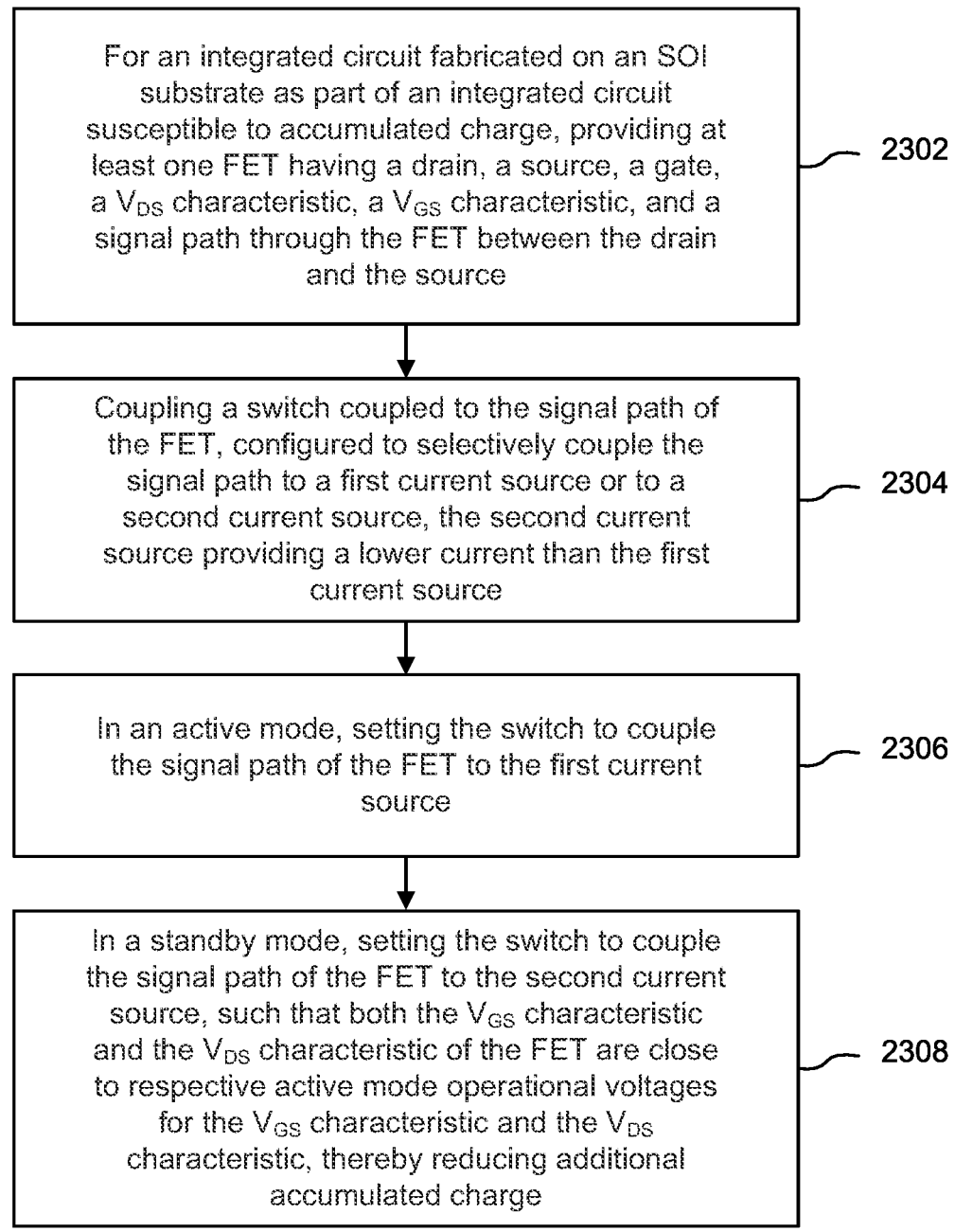
FIG. 23 is a process flow diagram showing an eighth method for eliminating or reducing changes in accumulated charge in an integrated circuit fabricated on a silicon-oninsulator (SOI) substrate as part of an integrated circuit susceptible to accumulated charge.

FIG. 23 is a process flow diagram 2300 showing an eighth method for eliminating or reducing changes in accumulated charge in an integrated circuit fabricated on a silicon-on-insulator (SOI) as part of an integrated circuit substrate susceptible to accumulated charge, including: providing at least one FET having a drain, a source, a gate, a $V_{DS}$ characteristic, a $V_{GS}$ characteristic, and a signal path through the FET between the drain and the source (STEP 2302); coupling a switch coupled to the signal path of the FET, configured to selectively couple the signal path to a first current source or to a second current source, the second current source providing a lower current than the first current source (STEP 2302); in an active mode, setting the switch to couple the signal path of the FET to the first current source (STEP 2302); and in a standby mode, setting the switch to couple the signal path of the FET to the second current source, such that both the $V_{GS}$ characteristic and the $V_{DS}$ characteristic of the FET are close to respective active mode operational voltages for the $V_{GS}$ characteristic and the $V_{DS}$ characteristic, thereby reducing changes in accumulated charge (STEP 2302).

FIG. 24 is a process flow diagram 2400 showing a ninth method for eliminating or reducing changes in accumulated charge in an integrated circuit susceptible to accumulated charge and fabricated on a silicon-on-insulator (SOI) substrate, including: providing at least one field effect transistor (FET) having a $V_{DS}$ characteristic and a $V_{GS}$ characteristic (STEP 2402); and configuring the at least one FET such that, in a standby mode, no significant current flows through the FET while maintaining essentially the same $V_{DS}$ characteristic and $V_{GS}$ characteristic as during an active mode, thereby eliminating or reducing changes in accumulated charge (STEP 2404).

Other aspects of the above methods may include one or more of the following: the standby mode pseudo-load voltage source outputting a voltage approximately equal to the voltage present on the drain of the FET during active mode operation; the trickle current path having a high resistance relative to the normal current flow path; providing a regulated current source coupled to the trickle current path that allows only a trickle of current to flow through the FET relative to the normal current flow path; the high resistance being at least about 100 times greater than the load resistance; the SOI substrate including a trap rich layer susceptible to accumulated charge in or near such trap rich layer; and/or providing one or more (e.g., at least a partial ring) substrate contacts (S-contacts) near or around at least one FET.

Fabrication Technologies and Options

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice. Various embodiments of the invention may be implemented in any suitable IC technology (including but not limited to MOSFET and IGFET structures) that exhibits accumulated charge, including (but not limited to) silicon-on-insulator (SCI) and silicon-on-sapphire (SOS).

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

The term "circuit ground" includes a reference potential, and is not limited to an earth ground or other "hard" ground.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An integrated circuit susceptible to accumulated charge and fabricated on a silicon-on-insulator (SOI) high resistivity substrate, including at least one field effect transistor (FET) having a $V_{GS}$ characteristic and configured such that, in a standby mode, current flow through the FET is interrupted while maintaining essentially the same $V_{GS}$ characteristic as during an active mode, thereby eliminating or reducing changes in accumulated charge, further including at least one substrate contact near at least one FET, each substrate contact comprising a resistive conduction path formed between a first contact region at a surface of a layer of the integrated circuit and a second contact region at or near a surface of the high resistivity substrate, wherein each substrate contact penetrates through at least one dielectric layer.

2. The invention of claim 1, wherein the SOI substrate includes a trap rich layer susceptible to accumulated charge in or near such trap rich layer and each substrate contact penetrates into the trap rich layer.

3. The invention of claim 1, further including at least a partial ring of substrate contacts around at least one FET.

4. A circuit fabricated on a high resistivity silicon-on-insulator (SOI) substrate as part of an integrated circuit susceptible to accumulated charge, the circuit including, the circuit including:
(a) at least one field effect transistor (FET) having a drain, a source, a gate, a $V_{GS}$ characteristic, and a signal path through the FET between the drain and the source;
(b) a switch coupled to the signal path of the FET, configured to selectively couple the signal path to a load or interrupt current flow through the signal path of the FET; and
(c) at least one substrate contact near at least one FET, each substrate contact comprising a resistive conduction path formed between a first contact region at a surface of a layer of the integrated circuit and a second contact region at or near a surface of the high resistivity SOI substrate, wherein each substrate contact penetrates through at least one dielectric layer;
wherein, in an active mode, the switch couples the signal path of the FET to the load; and
wherein, in a standby mode, the switch interrupts current flow through the signal path of the FET, thereby maintaining essentially the same $V_{GS}$ characteristic as during the active mode, and thereby eliminating or reducing changes in accumulated charge.

5. The invention of claim 4, wherein the SOI substrate includes a trap rich layer susceptible to accumulated charge in or near such trap rich layer and each substrate contact penetrates into the trap rich layer.

6. The invention of claim 4, further including at least a partial ring of substrate contacts around at least one FET.

7. A circuit fabricated on a high resistivity silicon-on-insulator (SOI) substrate as part of an integrated circuit susceptible to accumulated charge, the circuit including:
(a) at least one field effect transistor (FET) having a drain, a source, a gate, a $V_{DS}$ characteristic, a $V_{GS}$ characteristic, and a signal path through the FET between the drain and the source; and
(b) a switch coupled to the signal path of the FET, configured to selectively couple the signal path to a first current source or to a second current source, the second current source providing a lower current than the first current source; and
(c) at least one substrate contact near at least one FET, each substrate contact comprising a resistive conduction path formed between a first contact region at a surface of a layer of the integrated circuit and a second contact region at or near a surface of the high resistivity SOI substrate, wherein each substrate contact penetrates through at least one dielectric layer;
wherein, in an active mode, the switch couples the signal path of the FET to the first current source; and
wherein, in a standby mode, the switch couples the signal path of the FET to the second current source, such that both the $V_{GS}$ characteristic and the $V_{DS}$ characteristic of the FET are close to respective active mode operational voltages for the $V_{GS}$ characteristic and the $V_{DS}$ characteristic, thereby reducing changes in accumulated charge.

8. The invention of claim 7, wherein the SOI substrate includes a trap rich layer susceptible to accumulated charge in or near such trap rich layer and each substrate contact penetrates into the trap rich layer.

9. The invention of claim 7, further including at least a partial ring of substrate contacts around at least one FET.

* * * * *